United States Patent
Yu et al.

(10) Patent No.: US 9,773,757 B2
(45) Date of Patent: Sep. 26, 2017

(54) DEVICES, PACKAGED SEMICONDUCTOR DEVICES, AND SEMICONDUCTOR DEVICE PACKAGING METHODS

(71) Applicant: Taiwan Semiconductor Manufacturing Company, Ltd., Hsin-Chu (TW)

(72) Inventors: Chen-Hua Yu, Hsin-Chu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/145,551

(22) Filed: May 3, 2016

(65) Prior Publication Data

US 2017/0207197 A1    Jul. 20, 2017

Related U.S. Application Data

(60) Provisional application No. 62/280,642, filed on Jan. 19, 2016.

(51) Int. Cl.

| | | |
|---|---|---|
| *H01L 23/04* | (2006.01) | |
| *H01L 23/34* | (2006.01) | |
| *H01L 21/48* | (2006.01) | |
| *H01L 21/50* | (2006.01) | |
| *H01L 25/065* | (2006.01) | |
| *H01L 23/31* | (2006.01) | |
| *H01L 23/528* | (2006.01) | |

(52) U.S. Cl.
CPC ...... *H01L 25/0657* (2013.01); *H01L 23/3114* (2013.01); *H01L 23/528* (2013.01); *H01L 2225/0651* (2013.01); *H01L 2225/06541* (2013.01)

(58) Field of Classification Search
CPC ....... H01L 2924/01079; H01L 2924/14; H01L 2924/15311; H01L 2924/01029; H01L 2924/01078; H01L 2224/16; H01L 2224/48091
USPC ........ 438/107, 109, 110, 127; 257/678, 684, 257/686, 687, 690, 698, 713, 723, 724
See application file for complete search history.

(56) References Cited

U.S. PATENT DOCUMENTS

| | | |
|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |

(Continued)

*Primary Examiner* — Hsien Ming Lee
(74) *Attorney, Agent, or Firm* — Slater Matsil, LLP

(57) ABSTRACT

Devices, packaged semiconductor devices, and methods of packaging semiconductor devices are disclosed. In some embodiments, a device includes a first interconnect structure, a first integrated circuit die coupled to the first interconnect structure, and a second integrated circuit die disposed over and coupled to the first integrated circuit die. A second interconnect structure is disposed over the second integrated circuit die. First through-vias are coupled between the first interconnect structure and the second interconnect structure, and second through-vias are coupled between the first integrated circuit die and the second interconnect structure. A molding material is disposed around the first integrated circuit die, the second integrated circuit die, the plurality of first through-vias, and the plurality of second through-vias.

20 Claims, 39 Drawing Sheets

(56) References Cited

U.S. PATENT DOCUMENTS

| | | |
|---|---|---|
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,354,297 B2 * | 1/2013 | Pagaila ............... H01L 25/16 257/678 |
| 8,361,842 B2 | 1/2013 | Yu et al. |
| 8,426,961 B2 | 4/2013 | Shih et al. |
| 8,669,174 B2 | 3/2014 | Wu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0001645 A1 | 1/2014 | Lin et al. |
| 2014/0203429 A1 | 7/2014 | Yu et al. |
| 2014/0225222 A1 | 8/2014 | Yu et al. |
| 2014/0225258 A1 | 8/2014 | Chiu et al. |
| 2014/0252572 A1 | 9/2014 | Hou et al. |
| 2014/0252646 A1 | 9/2014 | Hung et al. |
| 2014/0264930 A1 | 9/2014 | Yu et al. |

* cited by examiner

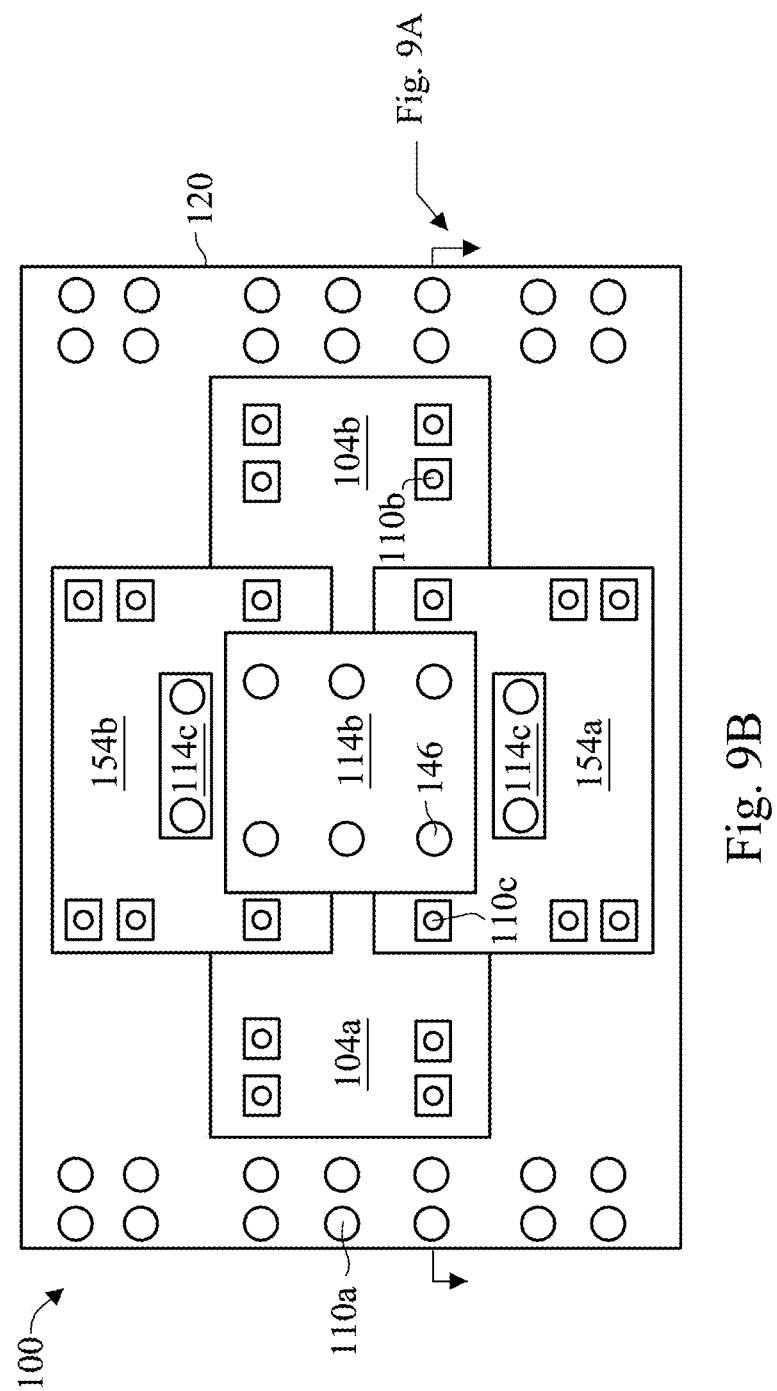

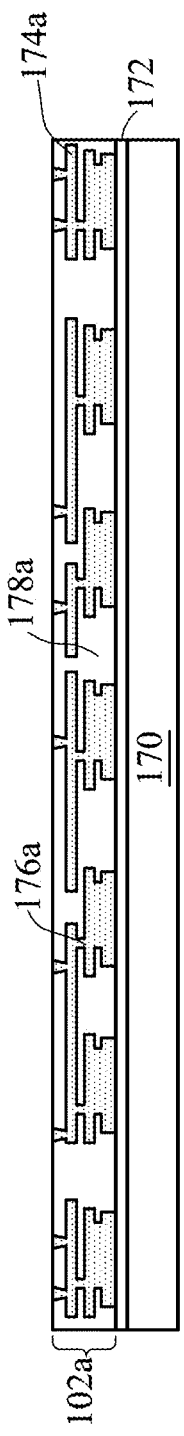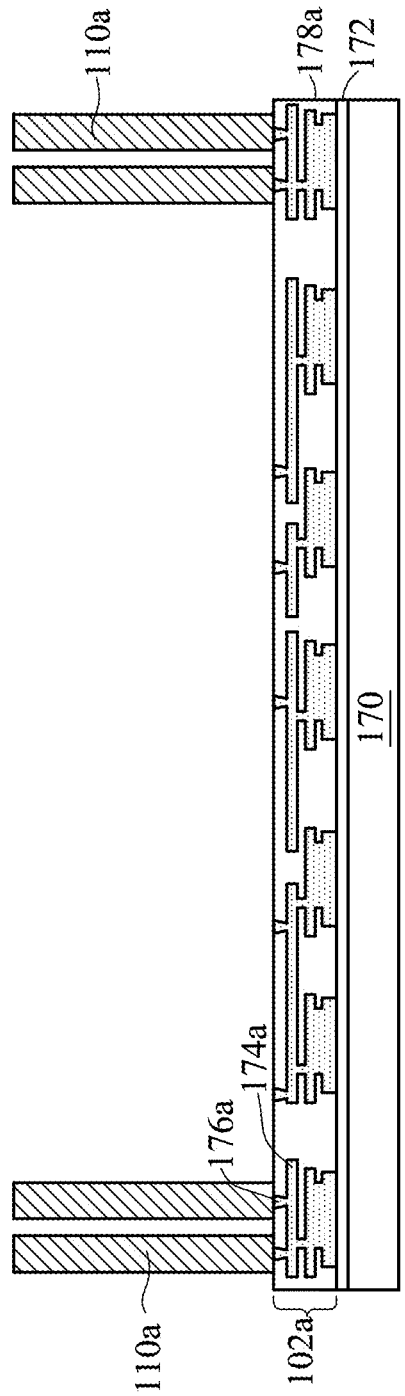
Fig. 15
Fig. 16

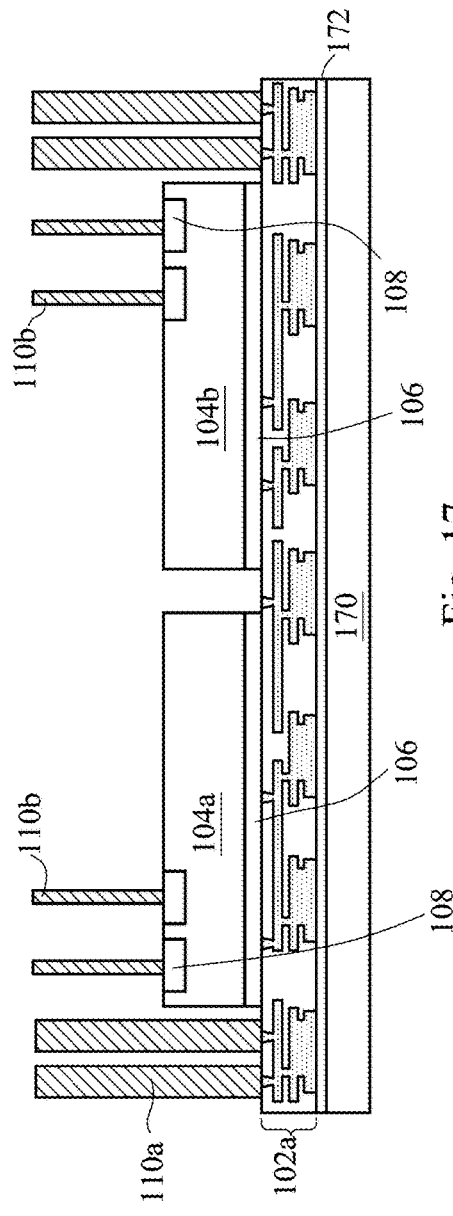
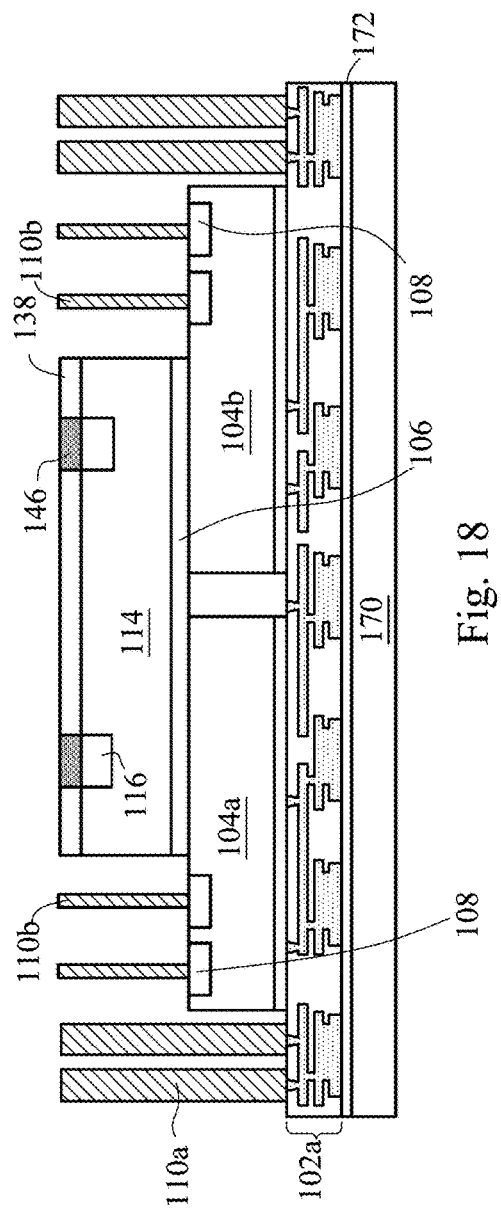
Fig. 17
Fig. 18

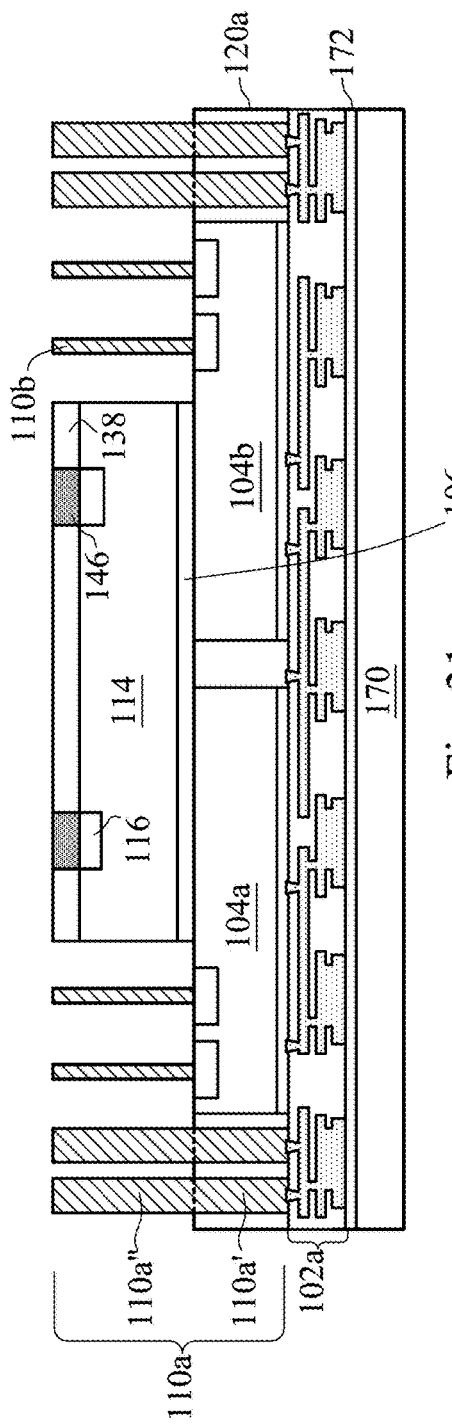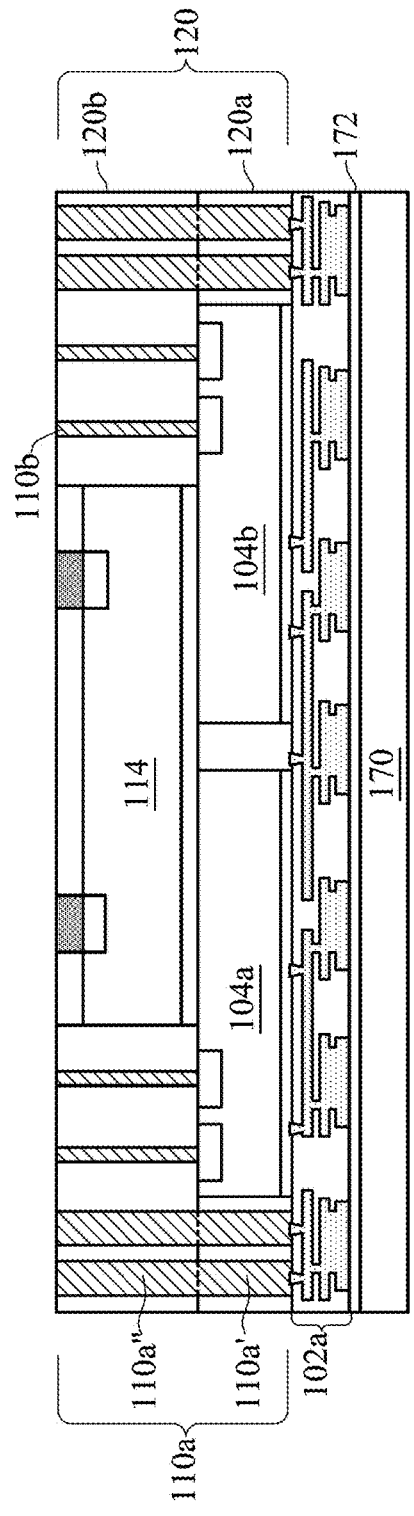

DEVICES, PACKAGED SEMICONDUCTOR DEVICES, AND SEMICONDUCTOR DEVICE PACKAGING METHODS

PRIORITY CLAIM AND CROSS-REFERENCE

This application claims the benefit of the following provisionally filed U.S. Patent application: Application Ser. No. 62/280,642, filed on Jan. 19, 2016 and entitled "Systems in a Package and Methods of Forming Same", which provisional patent application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

A three dimensional integrated circuit (3DIC's) is a packaging technique in which dies are stacked and packaged together, which reduces a footprint (form factor) of the packages. System in a package (SiP) is a packaging technique wherein multiple dies are packaged together to perform as a system or a sub-system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9B is a top view of a portion of the packaged semiconductor device shown in FIG. 9A in accordance with some embodiments.

FIGS. 15 through 22 are cross-sectional views illustrating a method of packaging semiconductor devices at various stages in accordance with some embodiments.

FIGS. 27 through 32 are cross-sectional views illustrating a method of packaging semiconductor devices at various stages in accordance with some embodiments.

DETAILED DESCRIPTION

Figure 1:
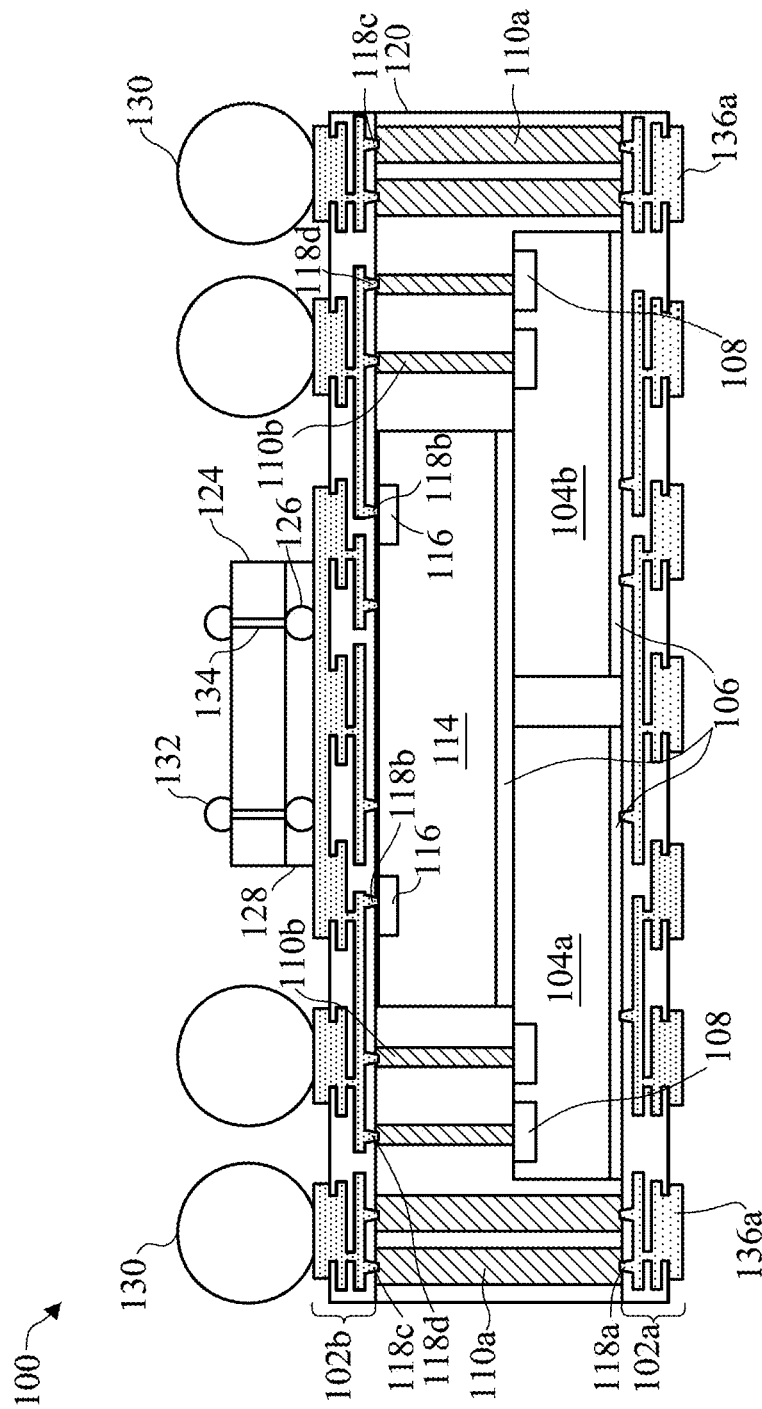
FIGS. 1 and 2 are cross-sectional views that illustrate packaged semiconductor devices in accordance with some embodiments of the present disclosure, wherein a plurality of first integrated circuit dies and a second integrated circuit die are packaged together.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Devices, packaged semiconductor devices, and semiconductor device packaging methods are disclosed in the present disclosure. Throughout the various views and illustrative embodiments, like reference numerals are used to designate like elements in some embodiments.

Various structures of packaged semiconductor devices that comprise 3DIC's and which may comprise SiP's in accordance with some embodiments will first be described, followed by some exemplary packaging process flows with more detailed descriptions of the various material layers and formation methods.

Figure 2:
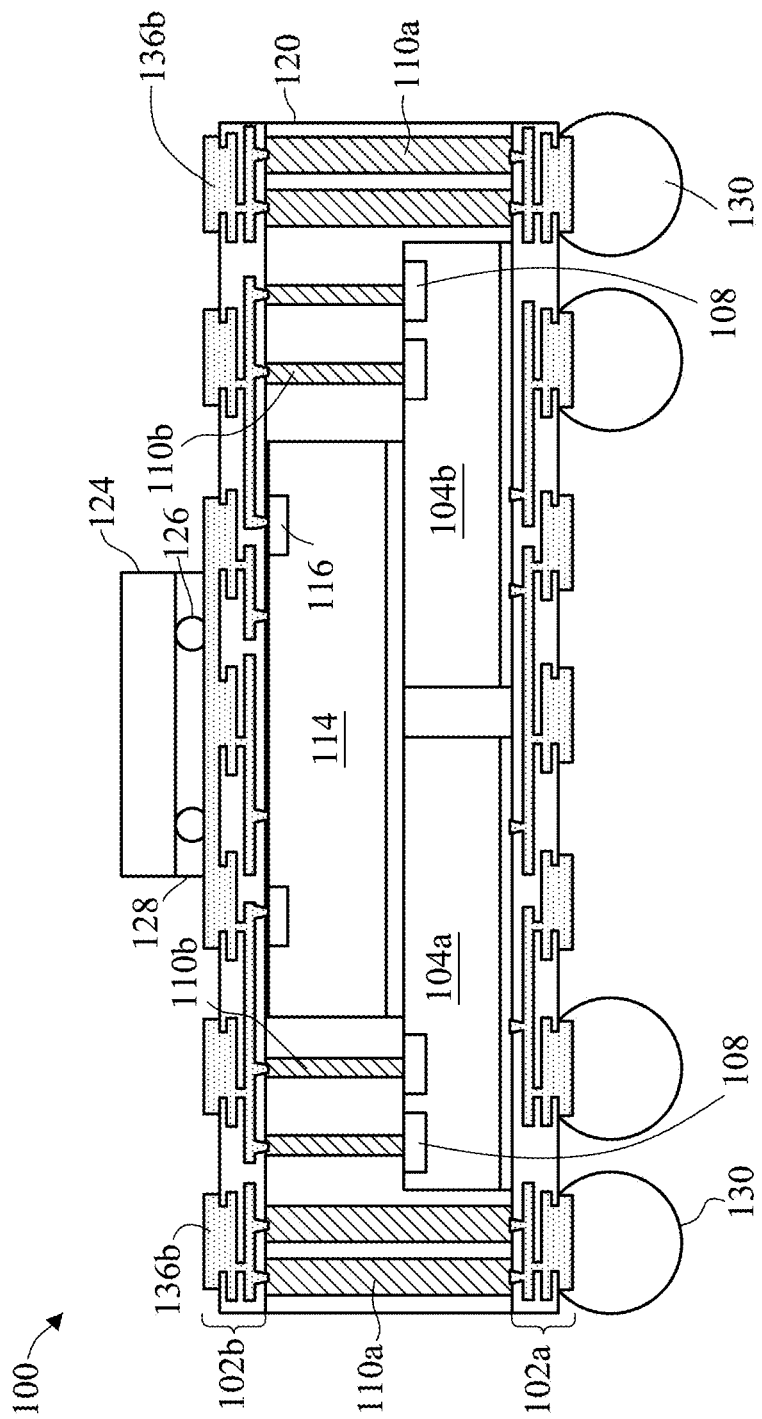

FIGS. 1 and 2 are cross-sectional views that illustrate packaged semiconductor devices 100 in accordance with some embodiments of the present disclosure, wherein a plurality of first integrated circuit dies 104a and 104b and one or more second integrated circuit dies 114 are packaged together. In FIG. 1, a packaged semiconductor device 100 includes a first interconnect structure 102a. The first interconnect structure 102a comprises a plurality of conductive features 136a proximate a surface thereof, wherein connectors may be coupled to the plurality of conductive features to make electrical connections to the packaged semiconductor device 100. The first interconnect structure 102a comprises a plurality of conductive features comprising conductive lines and conductive vias that are formed in one or more insulating material layers in some embodiments, which will be described further herein. The first interconnect structure 102a comprises a redistribution layer (RDL) or a post-passivation interconnect (PPI) structure in some embodiments, as examples.

A plurality of first integrated circuit dies 104a and 104b is coupled to the first interconnect structure 102a by an adhesive 106. The adhesive 106 may comprise a die attach film (DAF) or other types of adhesives or glue in some embodiments, for example. The plurality of first integrated circuit dies 104a and 104b may include a plurality of contact pads 108 disposed thereon. The plurality of first integrated circuit dies 104a and 104b may include a substrate that may comprise a part of a wafer, for example. The substrate may comprise a semiconductor substrate, such as a silicon substrate, a silicon carbon substrate, a silicon germanium substrate, or a substrate formed of other semiconductor materials, as examples. The substrate of the plurality of first integrated circuit dies 104a and 104b may comprise a bulk substrate, a semiconductor-on-insulator (SOI) substrate, or other acceptable types of substrates. The substrate of the plurality of first integrated circuit dies 104a and 104b may be lightly doped with a p-type or an n-type impurity. The substrate of the plurality of first integrated circuit dies 104a and 104b may comprise part of a silicon wafer or a wafer comprised of another type of semiconductor material in some embodiments.

The plurality of first integrated circuit dies 104a and 104b may comprise a square, rectangular, or other shapes in a top view, for example. Two first integrated circuit dies 104a and 104b are shown in FIG. 1; one or more first integrated circuit dies 104a and 104b may be included in a packaged semiconductor device 100 in some embodiments.

Active circuitry may be formed in active circuit regions of the plurality of first integrated circuit dies 104a and 104b. The active circuitry in the active circuit regions may be disposed in an upper portion of the substrates of the plurality of first integrated circuit dies 104a and 104b in the view shown in FIG. 1, for example. The active circuitry may comprise any type of circuitry suitable for a particular application. The active circuitry may comprise one or more logic, memory, processor, radio frequency (RF), analog, ASIC, sensor, power management (PM) IC, integrated passives device (IPD) or other type of devices, as examples. As other examples, the active circuitry formed within or on the active circuit regions of the substrate may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, and/or the like. One of ordinary skill in the art will appreciate that the above examples are provided for illustrative purposes to further explain applications of some illustrative embodiments and are not meant to limit the disclosure in any manner. The plurality of first integrated circuit dies 104a and 104b may also comprise other active circuitry as appropriate for a given application.

A second integrated circuit die 114 is coupled to the plurality of first integrated circuit dies 104a and 104b by an adhesive 106. A plurality of second integrated circuit dies 114 may be coupled to the plurality of first integrated circuit dies 104a and 104b in some embodiments. The second integrated circuit die 114 may comprise similar materials and functional circuitry as described for the plurality of first integrated circuit dies 104a and 104b, for example.

A second interconnect structure 102b is disposed over the plurality of first integrated circuit dies 104a and 104b and the second integrated circuit die(s) 114. The second interconnect structure 102b comprises a plurality of conductive features comprising conductive lines and conductive vias that are formed in one or more insulating material layers in some embodiments. The second interconnect structure 102b comprises an RDL or a PPI structure in some embodiments, as examples. Conductive features of the second integrated circuit die(s) 114 which may comprise contact pads 116, as examples, are coupled to conductive features 118b of the second interconnect structure 102b.

A plurality of first through-vias 110a is coupled between the first interconnect structure 102a and the second interconnect structure 102b. Each of the plurality of first through-vias 110a extends between a conductive feature 118a of the first interconnect structure 102a and a conductive feature 118c of the second interconnect structure 102b. The conductive features 118a and 118c may comprise contact pads, landing pads, vias, or other types of features that are conductive and may comprise a metal, for example.

A plurality of second through-vias 110b is coupled between the plurality of first integrated circuit dies 104a and 104b and the second interconnect structure 102b. Each of the plurality of second through-vias 110b extends between a conductive feature such as a contact pad 108 of the plurality of first integrated circuit dies 104a and 104b and a conductive feature 118d of the second interconnect structure 102b. The conductive features 118d may comprise contact pads, landing pads, vias, or other types of features that are conductive and may comprise a metal, for example.

A molding material 120 is disposed around the plurality of first integrated circuit dies 104a and 104b, the second integrated circuit die(s) 114, the plurality of first through-vias 110a, and the plurality of second through-vias 110b. The molding material 120 encapsulates the plurality of first integrated circuit dies 104a and 104b, the second integrated circuit die(s) 114, the plurality of first through-vias 110a, and the plurality of second through-vias 110b.

A plurality of connectors 130 is coupled to conductive features of the second interconnect structure 102b. The plurality of connectors 130 may be used to connect the packaged semiconductor device 100 to another device, another packaged semiconductor device, or to a circuit board or other object in an end application, as examples. Likewise, conductive features 136a of the first interconnect structure 102a may be used to make electrical connections to other devices or objects.

A third integrated circuit die or passive device 124 is coupled to a surface of the second interconnect structure 102b in some embodiments. The third integrated circuit die or passive device 124 may comprise similar materials and functional circuitry as described for the plurality of first integrated circuit dies 104a and 104b, for example.

In some embodiments, the third integrated circuit die or passive device 124 is not included in the packaged semiconductor device 100. The third integrated circuit die or passive device 124 may be coupled to conductive features of the second interconnect structure 102b by a plurality of connectors 126. An insulating material 128 may be disposed beneath the third integrated circuit die or passive device 124 between the third integrated circuit die or passive device 124 and a surface of the second interconnect structure 102b, around the plurality of connectors 126. The insulating material 128 may comprise an underfill material such as epoxy or other materials. The third integrated circuit die or passive device 124 may include through-vias 134 disposed therein. Connectors 132 are coupleable to the through-vias 134 and may be used to make electrical connections to another device, another packaged semiconductor device, or to a circuit board or other object in an end application, as examples. Note that the third integrated circuit die or passive device 124 is also referred to herein as a fourth integrated circuit die or passive device 124, e.g., in some embodiments wherein a third integrated circuit die 154a and/or 154b (see FIGS. 8A and 8B) is included between the first integrated circuit die(s) 104a and/or 104b and the second integrated circuit die(s) 114.

Thus, in accordance with some embodiments of the present disclosure, a packaged semiconductor device 100 shown in FIG. 1 includes a first interconnect structure 102a having first conductive features 118a disposed thereon. A plurality of first integrated circuit dies 104a and 104b is coupled to the first interconnect structure 102a, the plurality of first integrated circuit dies 104a and 104b having first contact pads 108 disposed thereon. A second integrated circuit die 114 is disposed over and is coupled to the first integrated circuit dies 104a and 104b, the second integrated circuit die 114 having second contact pads 116 disposed thereon. A second interconnect structure 102b is disposed over the second integrated circuit die 114, the second interconnect structure 102b having second conductive features 118b, third conductive features 118c, and fourth conductive features 118d disposed thereon, the second conductive features 118b of the second interconnect structure 102b being coupled to the second contact pads 116 of the second integrated circuit die 114. A plurality of first through-vias 110a is coupled between the first conductive features 118a of the first interconnect structure 102a and the third conductive features 118c of the second interconnect structure 102b. A plurality of second through-vias 110b is coupled between the first contact pads 108 of the first integrated circuit dies 104a and 104b and the fourth conductive features 118d of the second interconnect structure 102b. A molding material 120 is disposed around the first integrated circuit dies 104a and 104b, the second integrated circuit die 114, the plurality of first through-vias 110a, and the plurality of second through-vias 110b.

In some embodiments, the second conductive features 118b, third conductive features 118c, and fourth conductive features 118d of the second interconnect structure 102b are disposed on a first side of the second interconnect structure 102b, and a third integrated circuit die or a passive device 124 is coupled to a second side of the second interconnect structure 102b, the second side of the second interconnect structure 102b being opposite the first side of the second interconnect structure 102b. In some embodiments, a plurality of connectors 130 is coupled to a second side of the second interconnect structure 102b.

FIG. 2 is a cross-sectional view of a packaged semiconductor device 100 that illustrates some embodiments of the present disclosure wherein a third integrated circuit or passive device 124 may be coupled to conductive features of the second interconnect structure 102b by a plurality of connectors 126. An insulating material 128 may be disposed beneath the third integrated circuit or passive device 124 between the third integrated circuit or passive device 124 and a surface of the second interconnect structure 102b, around the plurality of connectors 126. The third integrated circuit or passive device 124 does not include through-vias disposed therein in some of the embodiments shown in FIG. 2. Connectors 130 are coupleable to conductive features of the first interconnect structure 102a and may be used to make electrical connections to another device, another packaged semiconductor device, or to a circuit board or other object in an end application, as examples. Likewise, conductive features 136b of the second interconnect structure 102b may be used to make electrical connections to other devices or objects.

In some embodiments, first conductive features 118a (see FIG. 1) of the first interconnect structure 102a are disposed on a first side of the first interconnect structure 102a, and a packaged semiconductor device 100 further includes a plurality of connectors 130 coupled to a second side of the first interconnect structure 102a as shown in FIG. 2, the second side of the first interconnect structure 102a being opposite the first side of the first interconnect structure 102a.

Figure 3:
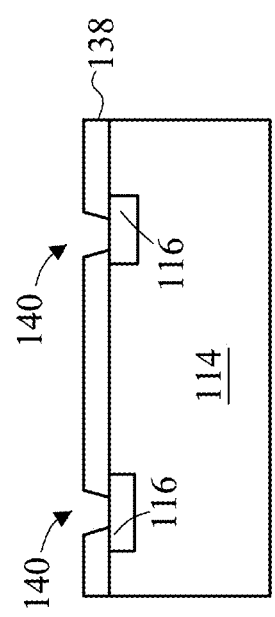
FIG. 3 is a more detailed cross-sectional view of an integrated circuit die shown in FIGS. 1 and 2 in accordance with some embodiments, wherein contact pads are disposed proximate a surface of the integrated circuit die.

FIG. 3 is a more detailed cross-sectional view of a second integrated circuit die 114 shown in FIGS. 1 and 2 in accordance with some embodiments, wherein contact pads 116 are disposed proximate a surface of the second integrated circuit die 114. The contact pads 116 comprise input/output connections of the second integrated circuit die(s) 114 in some embodiments, for example. An insulating material layer 138 is disposed over the second integrated circuit die(s) 114 and portions of the contact pads 116 in some embodiments. The insulating material layer 138 may comprise a passivation layer comprised of a polymer such as polybenzoxazole (PBO), polyimide (PI), SiN, and the like in some embodiments. The insulating material layer 138 may also comprise other materials. Openings 140 are formed in the insulating material layer 138 over the contact pads 116 so that an electrical connection may be made to the contact pads 116 of the second integrated circuit die(s) 114. Conductive features of the second interconnect structure 102b (see FIGS. 1 and 2), such as conductive vias or conductive lines, are coupled to the contact pads 116 of the second integrated circuit die 114 through the openings 140 in the insulating material layer 138 in accordance with some embodiments, for example.

Figure 4:
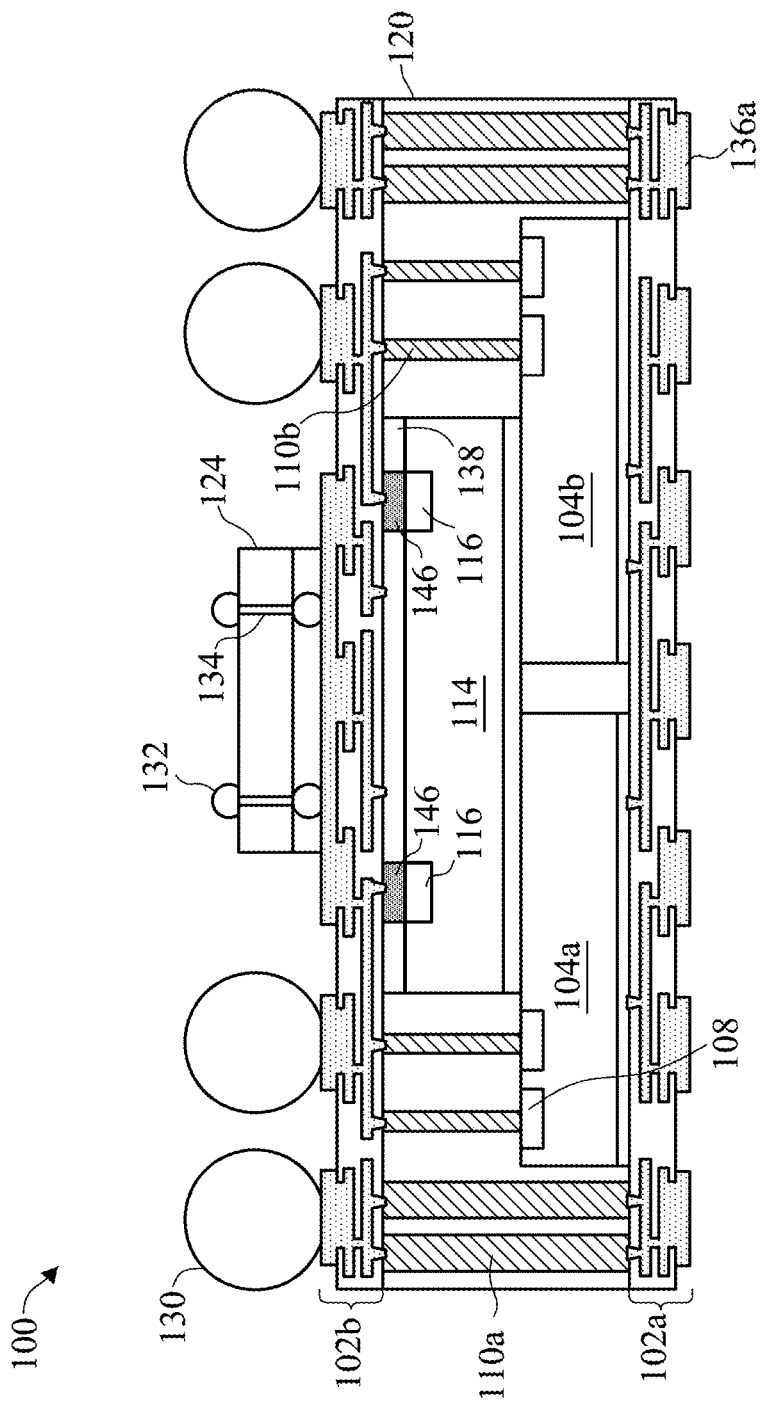
FIGS. 4 and 5 are cross-sectional views that illustrate packaged semiconductor devices in accordance with some embodiments of the present disclosure, wherein a plurality of first integrated circuit dies and a second integrated circuit die are packaged together.
Figure 5:
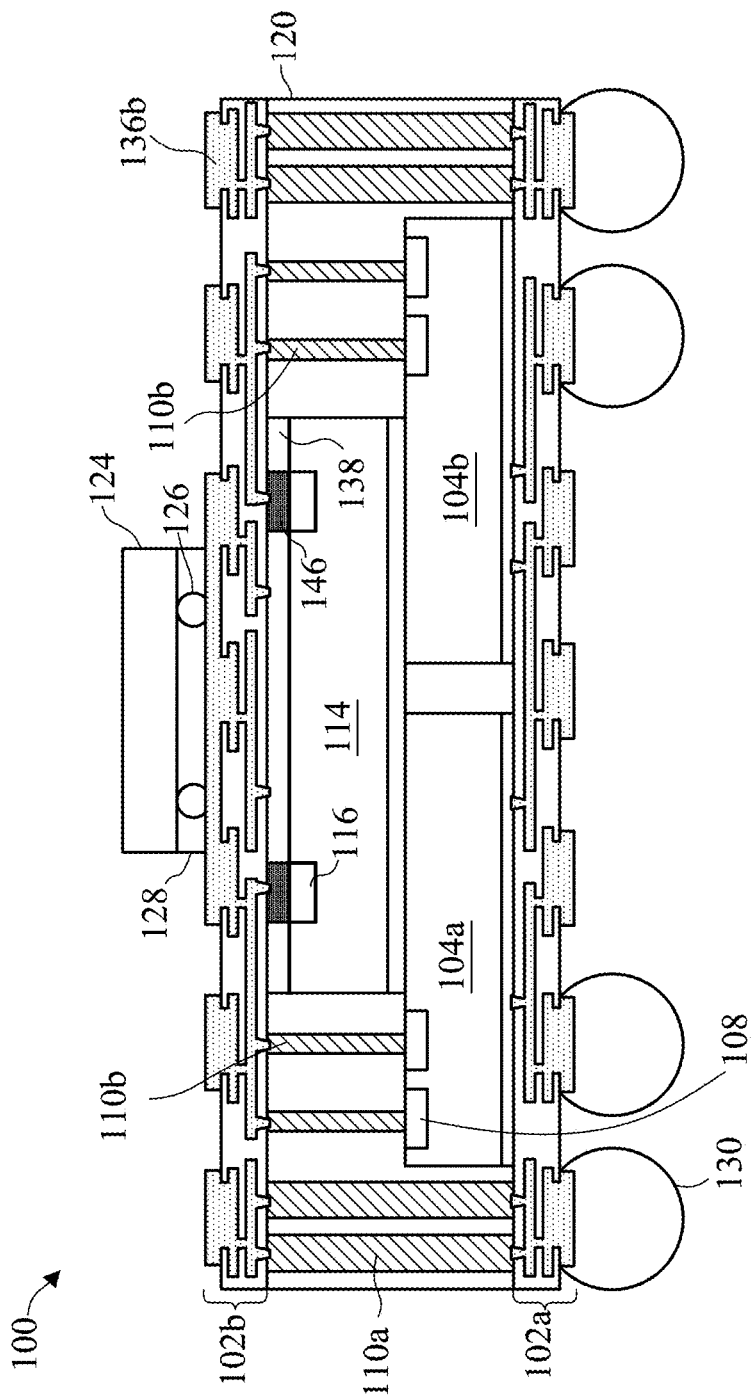
Figure 6:
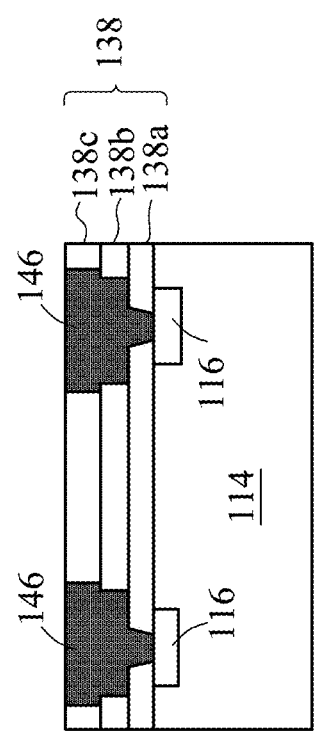
FIG. 6 is a more detailed cross-sectional view of an integrated circuit die shown in FIGS. 4 and 5 in accordance with some embodiments, wherein conductive pillars are coupled to contact pads of the integrated circuit die.

FIGS. 4 and 5 are cross-sectional views that illustrate packaged semiconductor devices 100 in accordance with some embodiments of the present disclosure, wherein a plurality of first integrated circuit dies 104a and 104b and a second integrated circuit die 114 are packaged together. FIG. 6 is a more detailed cross-sectional view of a second integrated circuit die 114 shown in FIGS. 4 and 5 in accordance with some embodiments, wherein conductive pillars 146 are coupled to contact pads 116 of the second integrated circuit die 114. The conductive pillars 146 are formed in an insulating material layer 138 that may comprise a plurality of insulating material layers 138a, 138b, and 138c in accordance with some embodiments. The plurality of insulating material layers 138a, 138b, 138c may comprise PBO, PI, SiN, and the likes as examples. Insulating material layers 138a, 138b, and 138c may also comprise other materials.

The conductive pillars 146 may comprise copper or a copper alloy in some embodiments. The conductive pillars 146 may comprise a circular and/or non-circular shape or other shapes from a top view, and the conductive pillars 146 may comprise a sidewall profile of a tapered shape, tiered shape, or vertical shape, depending on patterns of openings in the insulating material layers 138a, 138b, and 138c, as examples. Electrical connections are made to the contact pads 116 by the conductive pillars 146. The conductive pillars 146 may comprise copper posts that may have a tapered or tiered shape within the insulating material layers 138a, 138b, and 138c, for example.

Connectors 130 may be coupled to conductive features of the second interconnect structure 102b as shown in FIG. 4 or to conductive features of the first interconnect structure 102a as shown in FIG. 5. A third integrated circuit die or passive device 124 illustrated in FIGS. 4 and 5 may or may not be included in the packaged semiconductor device 100.

Figure 7:
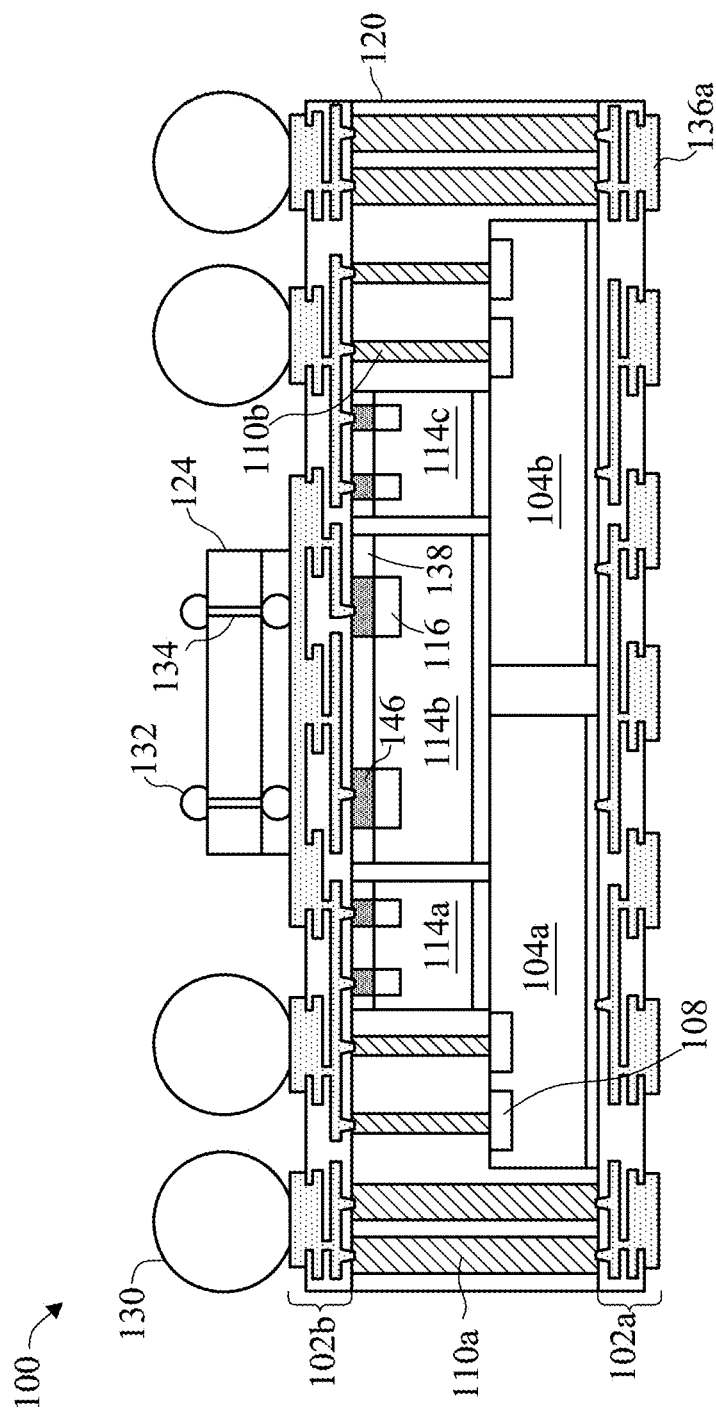
FIG. 7 is a cross-sectional view of a packaged semiconductor device in accordance with some embodiments, wherein a plurality of first integrated circuit dies and a plurality of second integrated circuit dies are packaged together.

FIG. 7 is a cross-sectional view of a packaged semiconductor device 100 in accordance with some embodiments, wherein a plurality of first integrated circuit dies 104a and 104b and a plurality of second integrated circuit dies 114a, 114b, and 114c are packaged together. Two first integrated circuit dies 104a and 104b and three second integrated circuit dies 114a, 114b, and 114c are illustrated in FIG. 7: one or more first integrated circuit dies 104a and/or 104b and one or more second integrated circuit dies 114a, 114b, and/or 114c may be included in a packaged semiconductor device 100 in accordance with some embodiments of the present disclosure.

Second integrated circuit dies 114a and 114c are fully landed on first integrated circuit dies 104a and 104b, respectively; for example, edges of second integrated circuit dies 114a and 114c do not overlap edges of the first integrated circuit dies 104a and 104b. Second integrated circuit die 114b straddles the underlying two first integrated circuit dies 104a and 104b; for example, edges of second integrated circuit die 114b overlap and extend past edges of the first integrated circuit dies 104a and 104b. A portion of the molding material 120 disposed between the first integrated circuit dies 104a and 104b is disposed beneath a portion of second integrated circuit die 114b.

The second integrated circuit dies 114a and 114c may include functional structures of logic, memory, IPD, analog, RF, ASIC, and the like, as examples. In accordance with some embodiments wherein second integrated circuit die 114b comprises a logic functional die, wherein first integrated circuit dies 104a and 104b comprise memory functional dies, and wherein second integrated circuit dies 114a and 114c comprise IPD functional dies, the second integrated circuit dies 114a and 114c comprising IPD functional dies may help to improve and regulate a power integrity of a packaged semiconductor device 100, for example. In accordance with some embodiments wherein second integrated circuit die 114b comprises a logic functional die, wherein first integrated circuit dies 104a and 104b comprise memory functional dies, and wherein second integrated dies 114a and 114c comprise RF data transceiver functional dies, the packaged semiconductor device 100 may comprise a communication sub-system adapted to provide data processing and data transceiver function, as another example. Combinations of different types of integrated circuit dies may also be used that achieve various advantages and form packaged semiconductor devices 100 with different types of overall functions.

In some embodiments illustrated in FIG. 7, contact pads 116 of the plurality of second integrated circuit dies 114a, 114b, and 114c are coupled to conductive features of the second interconnect structure 102b by conductive pillars 146. In some embodiments, contact pads 116 of the plurality of second integrated circuit dies 114a, 114b, and 114c are directly coupled to conductive features of the second interconnect structure 102b, as illustrated in FIGS. 1 and 2.

Connectors 130 may be coupled to conductive features of the second interconnect structure 102b as shown in FIG. 7 or to conductive features of the first interconnect structure 102a (not shown in FIG. 7; see FIGS. 2 and 5). A third integrated circuit die or passive device 124 may be included in the packaged semiconductor device 100, as illustrated in FIG. 7. A third integrated circuit die or passive device 124 may also not be included in the packaged semiconductor device 100. The third integrated circuit die or passive device 124 may include through-vias 134 formed therein and may include connectors 132 coupled thereto. The third integrated circuit die or passive device 124 may also not include through-vias 134 or connectors 132 (see FIG. 2 or FIG. 5).

Figure 8A:
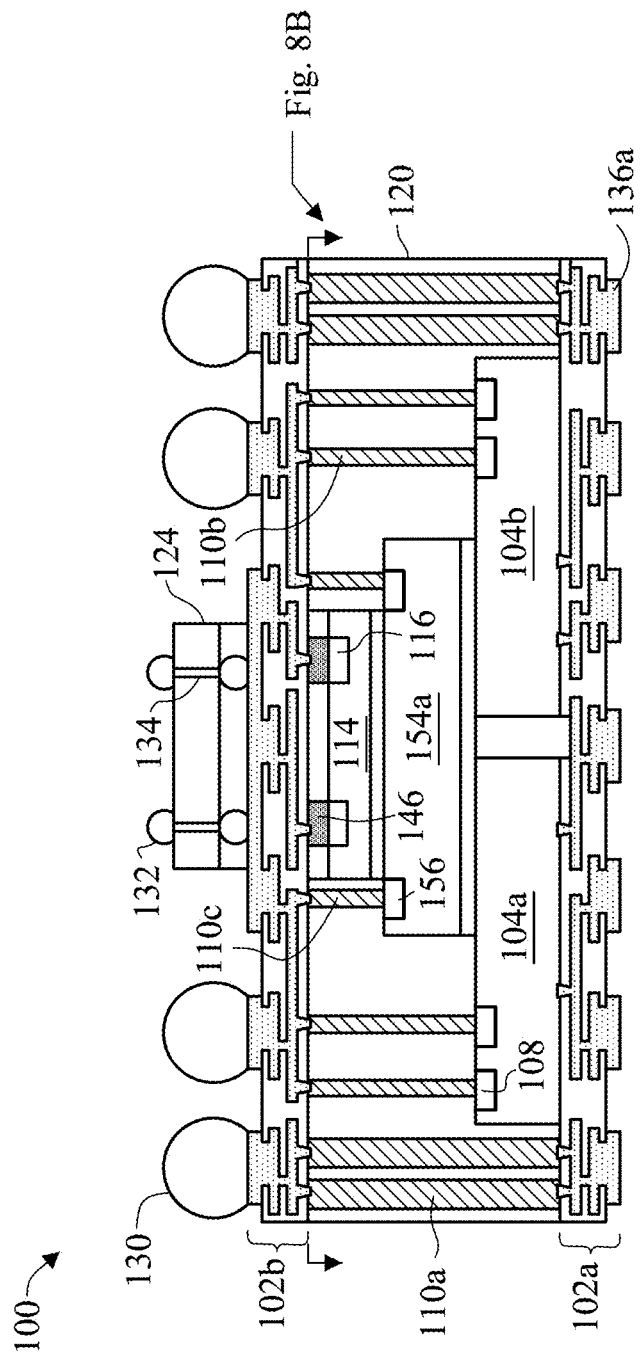
FIG. 8A is a cross-sectional view of a packaged semiconductor device in accordance with some embodiments, wherein a plurality of first integrated circuit dies, a second integrated circuit die, and a plurality of third integrated circuit dies are packaged together.
Figure 8B:
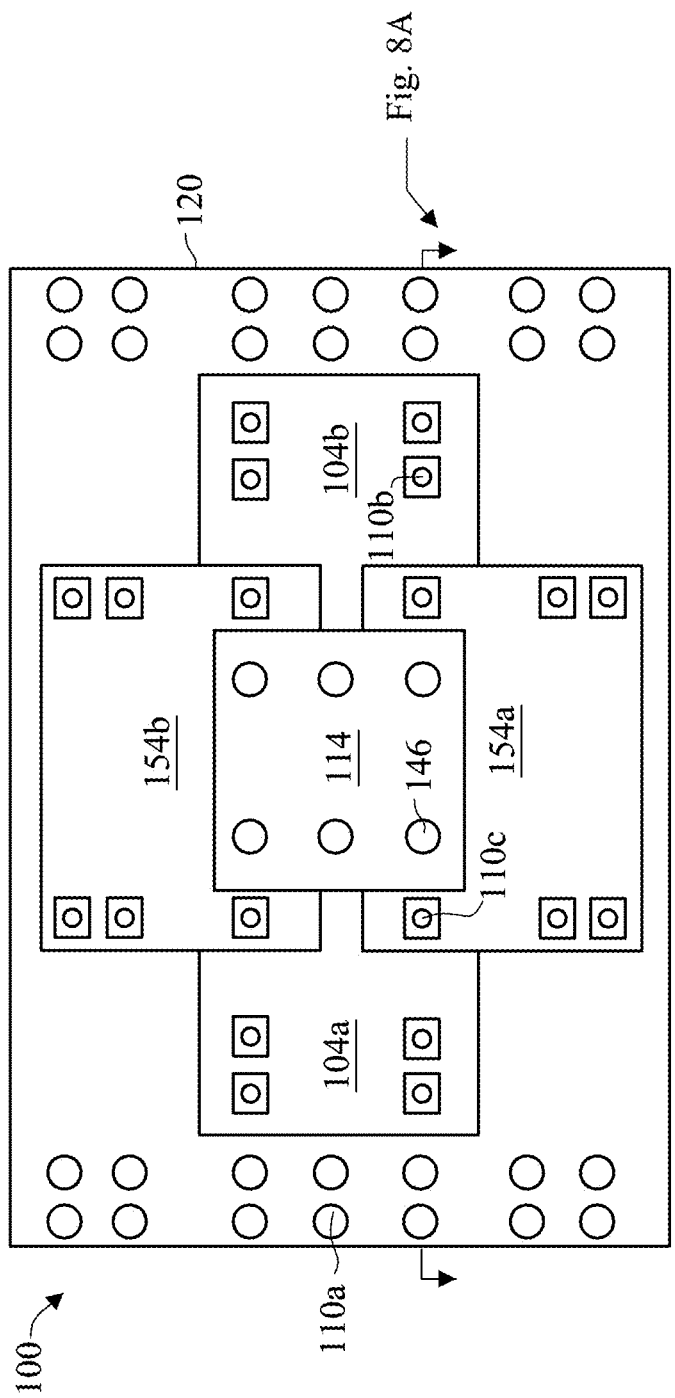
FIG. 8B is a top view of a portion of the packaged semiconductor device shown in FIG. 8A in accordance with some embodiments.

FIG. 8A is a cross-sectional view of a packaged semiconductor device 100 in accordance with some embodiments, wherein a plurality of first integrated circuit dies 104a and 104b, a second integrated circuit die 114, and a plurality of third integrated circuit dies 154a and 154b are packaged together. FIG. 8B is a top view of a portion of the packaged semiconductor device 100 shown in FIG. 8A in accordance with some embodiments. The plurality of third integrated circuit dies 154a and 154b is coupled between the plurality of first integrated circuit dies 104a and 104b and the second integrated circuit die 114. The plurality of third integrated circuit dies 154a and 154b are cross-stacked on top of the plurality of first integrated circuit dies 104a and 104b. The plurality of third integrated circuit dies 154a and 154b is electrically coupled to conductive features of the second interconnect structure 102b by a plurality of third through-vias 110c. The plurality of third through-vias 110c are coupled at one end to contact pads 156 of the plurality of third integrated circuit dies 154a and 154b and at the other opposite end to conductive features of the second interconnect structure 102b. Contact pads 116 of the second integrated circuit die 114 are coupled to the second interconnect structure 102b by conductive pillars 146. Contact pads 116 of the second integrated circuit die 114 may also be coupled directly to the second interconnect structure 102b, as shown in FIGS. 1 and 2.

Figure 9A:
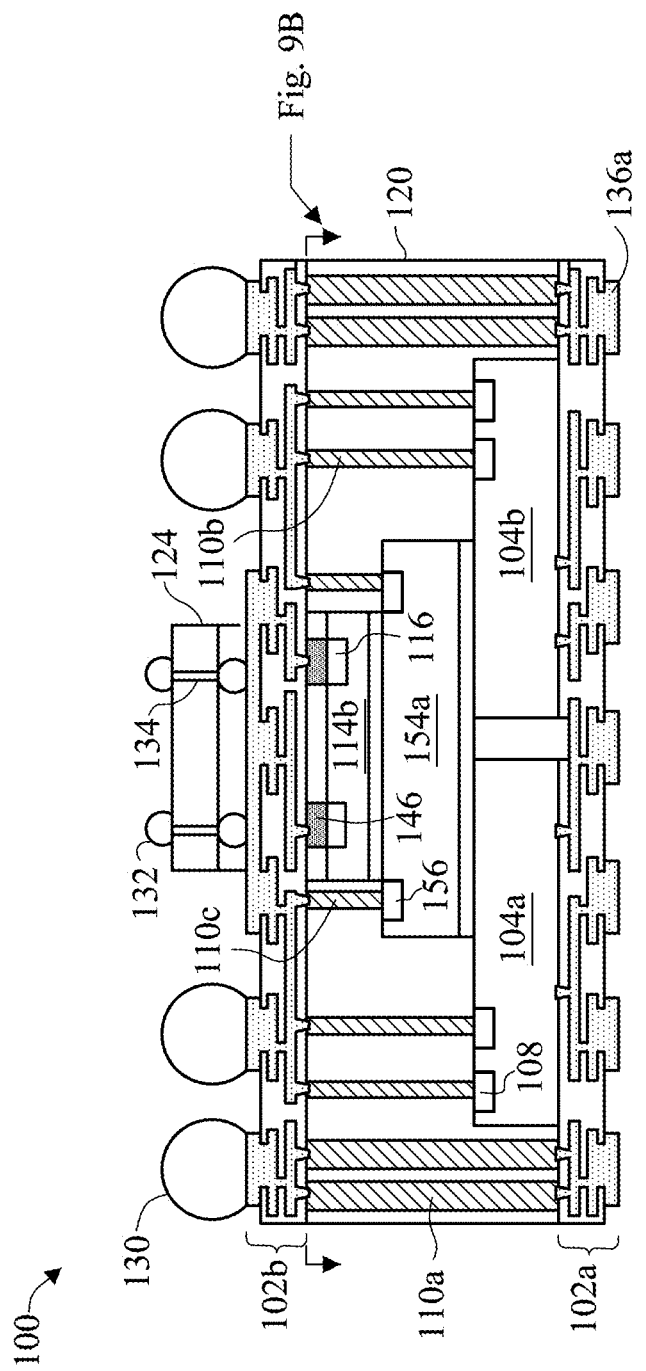
FIG. 9A is a cross-sectional view of a packaged semiconductor device in accordance with some embodiments, wherein a plurality of first integrated circuit dies, a plurality of second integrated circuit dies, and a plurality of third integrated circuit dies are packaged together.

FIG. 9A is a cross-sectional view of a packaged semiconductor device 100 in accordance with some embodiments, wherein a plurality of first integrated circuit dies 104a and 104b, a plurality of second integrated circuit dies 114a, 114b, and 114c, and a plurality of third integrated circuit dies 154a and 154b are packaged together. FIG. 9B is a top view of a portion of the packaged semiconductor device 100 shown in FIG. 9A in accordance with some embodiments. The plurality of third integrated circuit dies 154a and 154b is coupled between the plurality of first integrated circuit dies 104a and 104b and the plurality of second integrated circuit dies 114a, 114b, and 114c. The plurality of third integrated circuit dies 154a and 154b is electrically coupled to conductive features of the second interconnect structure 102b by a plurality of third through-vias 110c. Contact pads 116 of the plurality of second integrated circuit dies 114 are coupled to the second interconnect structure 102b by conductive pillars 146. Contact pads 116 of the plurality of second integrated circuit dies 114 may also be coupled directly to the second interconnect structure 102b, as shown in FIGS. 1 and 2.

In the embodiments shown in FIGS. 8A, 8B, 9A, and 9B, connectors 130 may be coupled to conductive features of the second interconnect structure 102b as shown, or connectors 130 may be coupled to conductive features of the first interconnect structure iota, as shown in FIGS. 2 and 5. The stacked integrated circuit dies 104a, 104b, 154a, 154b, 114, 114a, 114b, and/or 114c may be symmetrically or asymmetrically stacked. A fourth integrated circuit die or passive device 124 may be included in the packaged semiconductor device 100, as illustrated in FIGS. 8A and 9A. A fourth integrated circuit die or passive device 124 may also not be included in the packaged semiconductor device 100. The fourth integrated circuit die or passive device 124 may include through-vias 134 formed therein and may include connectors 132 coupled thereto, illustrated. The fourth integrated circuit die or passive device 124 may also not include through-vias 134 or connectors 132 (see FIG. 2 or FIG. 5).

Three layers of integrated circuit dies are illustrated in FIGS. 8A, 8B, 9A, and 9B. Four or more layers of integrated circuit dies may also be packaged together in some embodiments (not shown) within the molding material 120, with the top integrated circuit die layer being coupled to the second interconnect structure 102b by contact pads 116, and with the lower integrated circuit dies being coupled to the second interconnect structure 102b by through-vias 110b, 110c, . . . 110x formed in the molding material 120.

Figure 10:
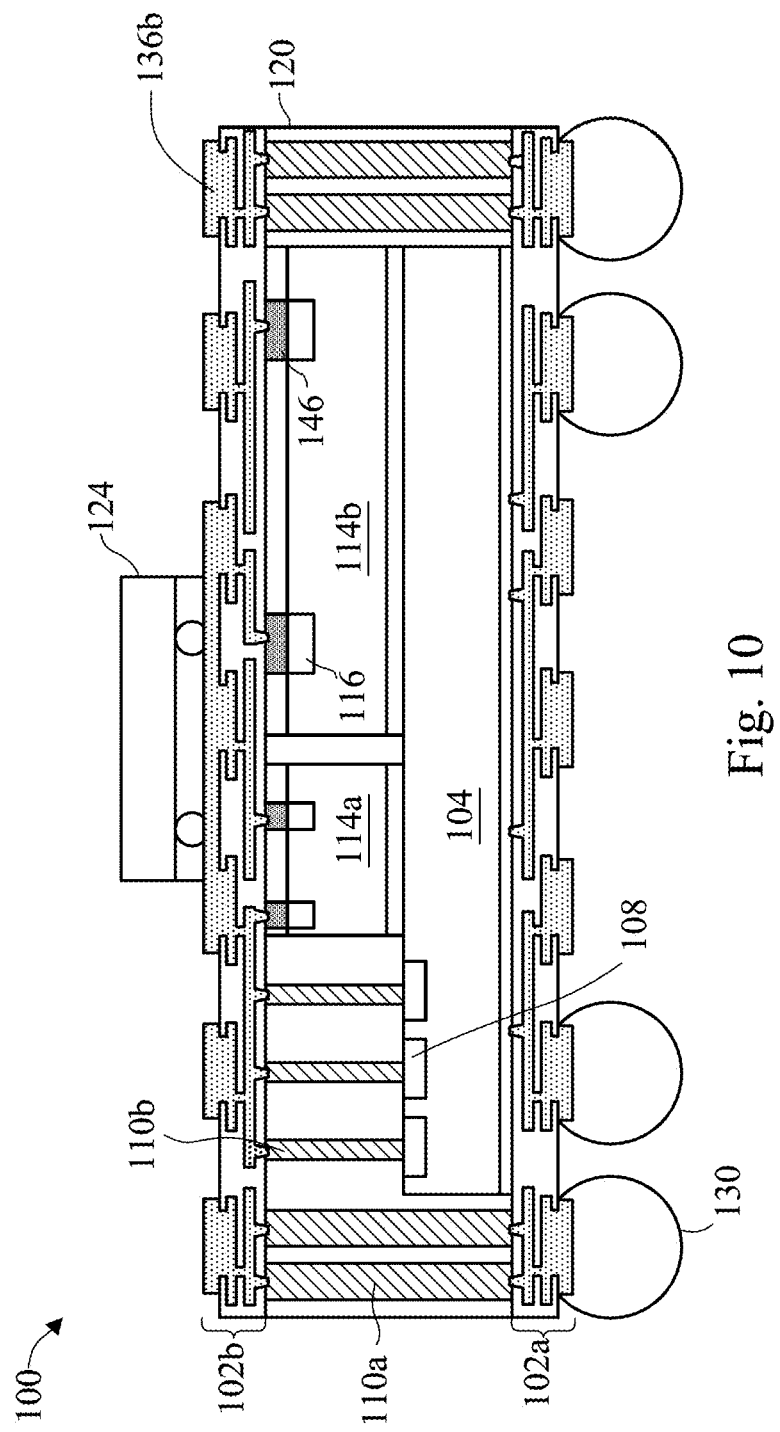
FIGS. 10 and 11 are cross-sectional views that illustrate packaged semiconductor devices in accordance with some embodiments of the present disclosure, wherein a first integrated circuit die and a plurality of second integrated circuit dies are packaged together.
Figure 11:
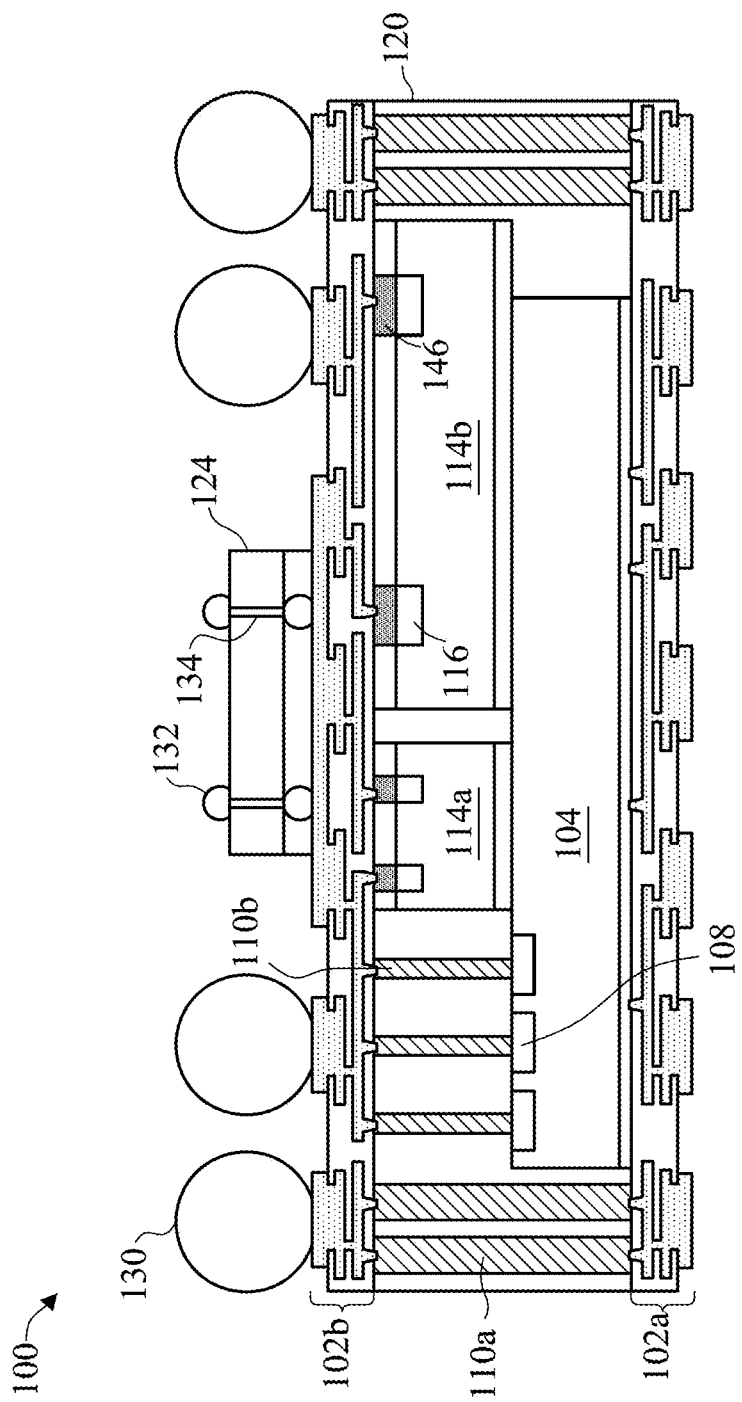

FIGS. 10 and 11 are cross-sectional views that illustrate packaged semiconductor devices 100 in accordance with some embodiments of the present disclosure, wherein a first integrated circuit die 104 and a plurality of second integrated circuit dies 114a and 114b are packaged together. The plurality of second integrated circuit dies 114a and 114b may comprise different sizes and may be asymmetrically connected to the first integrated circuit die 104. The plurality of second integrated circuit dies 114a and 114b may also comprise substantially the same size and/or may be symmetrically connected to the first integrated circuit die 104, not shown. The first integrated circuit die 104 is coupled to the second interconnect structure 102b by a plurality of second through-vias 110b disposed on one or more sides of the first integrated circuit die 104 (e.g., on the left side in FIGS. 10 and 11). The plurality of second integrated circuit dies 114a and 114b may be coupled to another side of the first integrated circuit die 104 (e.g., on the right side in FIGS. 10 and 11). The plurality of second integrated circuit dies 114a and 114b may also be coupled to the first integrated circuit die 104 in other configurations.

The plurality of second integrated circuit dies 114a and 114b may be fully landed on the first integrated circuit die 104 as shown in FIG. 10, or one or more of the plurality of second integrated circuit dies 114a and 114b may have one or more edges that extend over an edge of the first integrated circuit die 104, as shown in FIG. 11. Second integrated circuit die 114b overhangs the lower first integrated circuit die 104 and thus, the first integrated circuit die 104 and second integrated circuit die 114b are partially stacked. Coupling the second integrated circuit die 114b to the first integrated circuit die 104 comprises extending a portion of the second integrated circuit die 114b over an edge of the first integrated circuit die 104 in some embodiments, for example.

Figure 12:
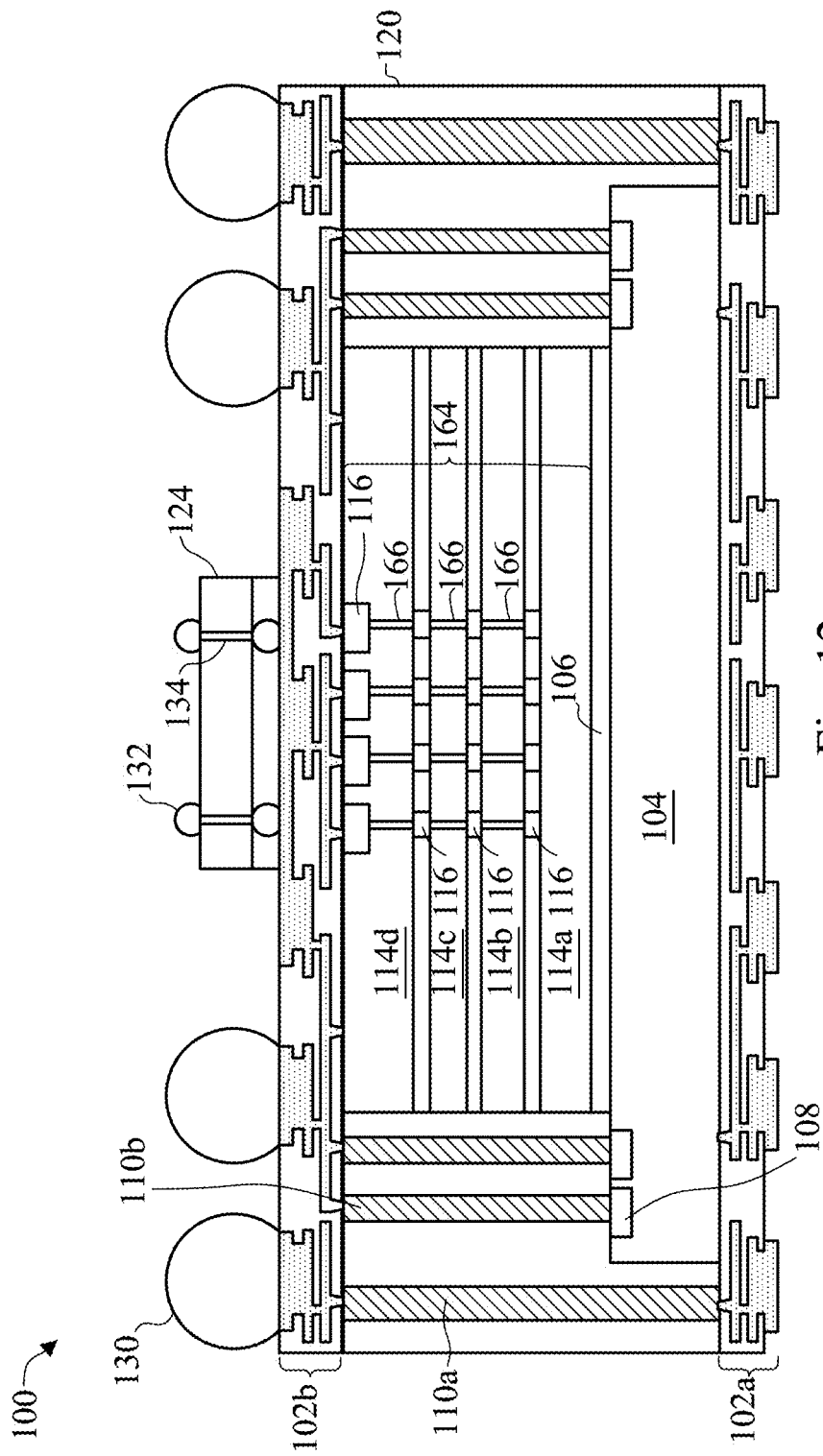
FIGS. 12 through 14 are cross-sectional views that illustrate packaged semiconductor devices in accordance with some embodiments of the present disclosure, wherein a first integrated circuit die and a plurality of vertically stacked second integrated circuit dies are packaged together.
Figure 13:
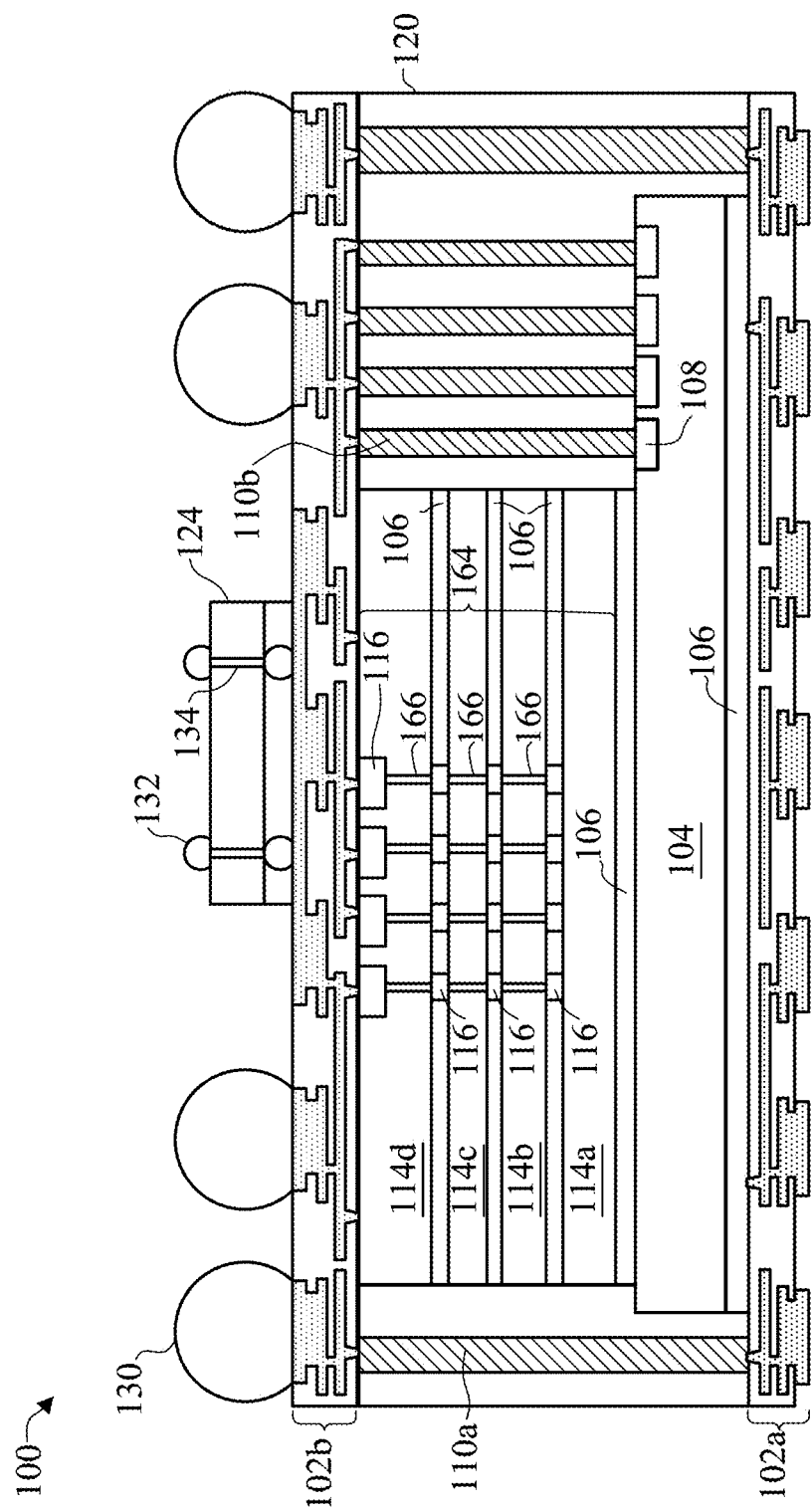
Figure 14:
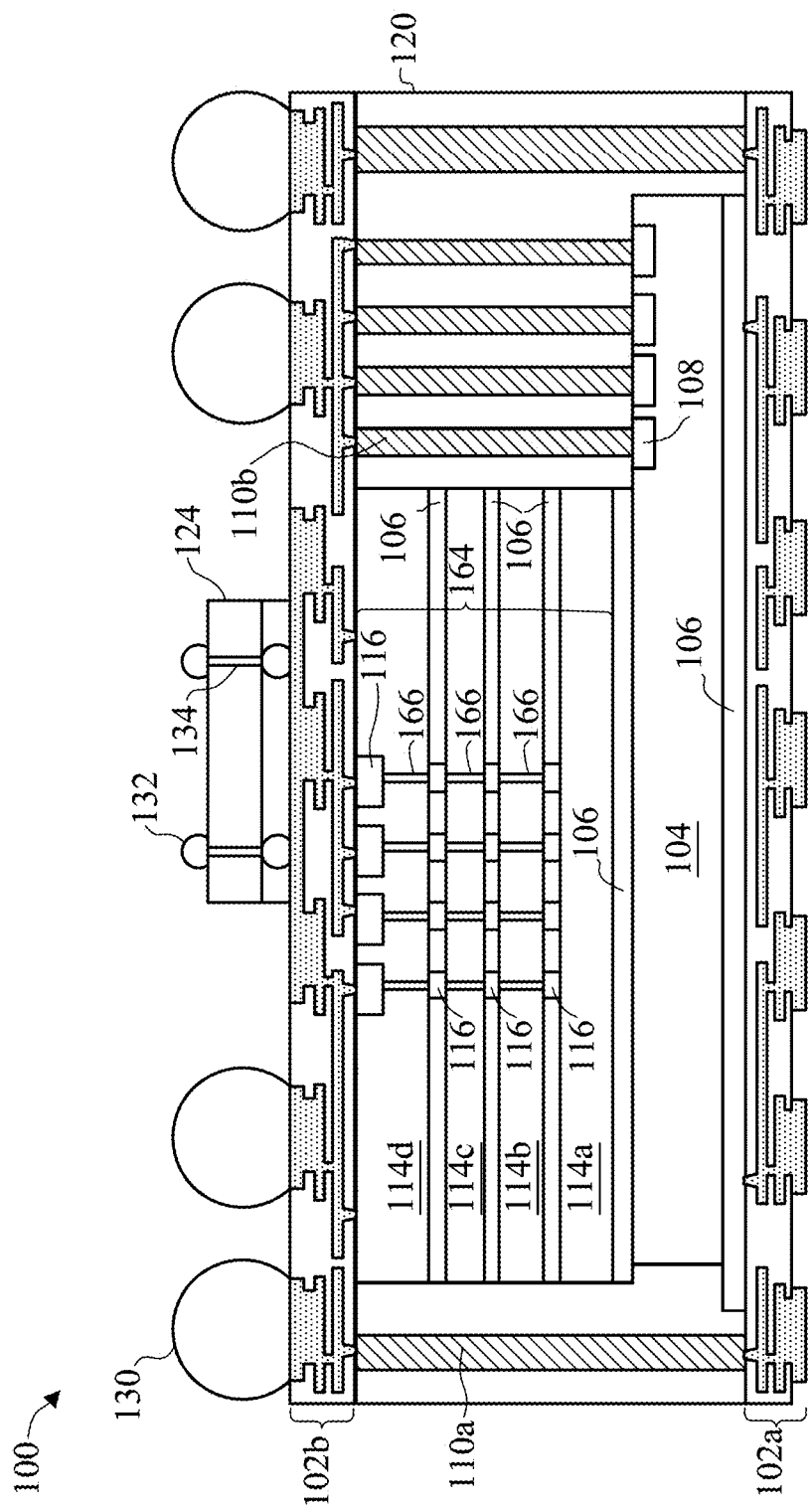

FIGS. 12 through 14 are cross-sectional views that illustrate packaged semiconductor devices 100 in accordance with some embodiments of the present disclosure, wherein a first integrated circuit die 104 and a plurality of vertically stacked second integrated circuit dies 114a, 114b, 114c, and 114d are packaged together. The plurality of vertically stacked second integrated circuit dies 114a, 114b, 114c, and 114d comprise a multiple chip stack 164 in some embodiments. The multiple chip stack 164 comprises four second integrated circuit dies 114a, 114b, 114c, and 114d in some of the embodiments shown: the multiple chip stack 164 may also comprise other numbers of second integrated circuit dies 114a, 114b, 114c, and 114d, such as two, three, or five or more. At least some of the plurality of vertically stacked second integrated circuit dies 114a, 114b, 114c, and 114d include through-vias 166 disposed thereon that provide vertical electrical connections between contact pads 116 of adjacent ones of the plurality of vertically stacked second integrated circuit dies 114a, 114b, 114c, and 114d. The upper-most or top second integrated circuit die 114d is coupled to conductive features of the second interconnect structure 102b in some embodiments. Contact pads 116 of the top second integrated circuit die 104d are directly coupled to the conductive features of the second interconnect structure 102b in some of the embodiments shown. Contact pads 116 of the top second integrated circuit die 104d may also be coupled to the conductive features of the second interconnect structure 102b by conductive pillars 146 (see FIG. 6).

In some embodiments illustrated in FIG. 12, the multiple chip stack 164 is disposed in a substantially central region of the first integrated circuit die 104, and second through-vias 110b that electrically couple contact pads 108 of the first integrated circuit die 104 to conductive features of the second interconnect structure 102b are disposed around the multiple chip stack 164 proximate a perimeter or edges of the first integrated circuit die 104. The multiple chip stack 164 is substantially symmetrically coupled to the first integrated circuit die 104 in FIG. 12, for example. In FIG. 13, the multiple chip stack 164 is asymmetrically coupled to the first integrated circuit die 104. The multiple chip stack 164 is disposed proximate an edge (e.g., the left edge in FIG. 13) of the first integrated circuit die 104, and the second through-vias 110*b* are disposed proximate another edge (e.g., the right edge in FIG. 13) of the first integrated circuit die 104. The multiple chip stack 164 is fully landed on the first integrated circuit die 104 in some embodiments shown in FIGS. 12 and 13. The multiple chip stack 164 may also be partially landed on the first integrated circuit die 104 and may have one or more edges that extend past one or more edges of the first integrated circuit die 104, as illustrated in some of the embodiments shown in FIG. 14, wherein the multiple chip stack 164 is partially stacked over the first integrated circuit die 104 and overhangs an edge of the first integrated circuit die 104, for example.

In some embodiments, a plurality of second integrated circuit dies 114*a*, 114*b*, 114*c*, and 114*d* may be coupled to the first integrated circuit die 104, and coupling the plurality of second integrated circuit dies 114*a*, 114*b*, 114*c*, and 114*d* comprises coupling a vertical stack of the plurality of second integrated circuit dies 114*a*, 114*b*, 114*c*, and 114*d*, for example, as illustrated in FIGS. 12 through 14.

In the embodiments shown in FIGS. 10 through 14, connectors 130 may be coupled to conductive features of the second interconnect structure 102*b*, or connectors 130 may be coupled to conductive features of the first interconnect structure 102*a*. A third integrated circuit die or passive device 124 that may or may not include through-vias 134 formed therein and may or may not include connectors 132 coupled thereto may be included in the packaged semiconductor device 100. A third integrated circuit die or passive device 124 may also not be included within or on the packaged semiconductor devices 100, in some embodiments.

FIGS. 15 through 22 are cross-sectional views illustrating a method of packaging semiconductor devices 100 at various stages of a packaging process in accordance with some embodiments. In FIG. 15, first, a carrier 170 is provided. A plurality of packaged semiconductor devices 100 will be formed over the carrier 170, and the carrier 170 will later be removed before or after singulating a plurality of the packaged semiconductor devices 100 in some embodiments. A plurality of semiconductor devices comprising the first integrated circuit dies 104, 104*a*, and/or 104*b*, second integrated circuit dies 114, 114*a*, 114*b*, 114*c* and/or 114*d*, third or fourth integrated circuit dies or passive devices 124, and/or third integrated circuit dies 154*a* and/or 154*b* are packaged simultaneously over the carrier 170 and are then singulated into packaged semiconductor devices 100 in accordance with some embodiments of the present disclosure, for example.

The carrier 170 may comprise a glass carrier substrate, a ceramic carrier substrate, a wafer such as a semiconductor wafer, a tape, or the like. The carrier 170 may include a film 172 that may comprise a release layer formed thereon which may comprise a polymer-based material. The film 172 may be removed along with the carrier 170 from the overlying structures that will be formed in subsequent processing steps. In some embodiments, the release layer may comprise an epoxy-based thermal-release material, which loses its adhesive property when heated, such as a light-to-heat-conversion (LTHC) release coating. In other embodiments, the release layer may comprise an ultra-violet (UV) glue, which loses its adhesive property when exposed to UV light. The release layer may be dispensed as a liquid and cured, and may be a laminate film laminated onto the carrier 170, or the like. An adhesive (also not shown) may be formed or dispensed over the release layer on the carrier 170. The adhesive may comprise a die attach film (DAF), a glue, a polymer material, or the like.

The first interconnect structure 102*a* is formed over the carrier 170 over the film 172, which is also shown in FIG. 15. The first interconnect structure 102*a* may comprise a back side interconnect structure in some embodiments, for example. The first interconnect structure 102*a* may comprise an RDL or a PPI structure in some embodiments. Forming the first interconnect structure 102*a* comprises forming an RDL comprising fan-out wiring in some embodiments, for example. The first interconnect structure 102*a* may be formed by forming one or more conductive line 174*a* layers and one or more conductive via 176*a* layers that include insulating material layer or layers 178*a* disposed around the conductive lines 174*a* and conductive vias 176*a*. For example, in FIG. 15, several conductive line 174*a* layers and several conductive via 176*a* layers are shown, with alternating layers of the conductive lines 174*a* and conductive vias 176*b*. The conductive lines 174*a* and conductive vias 176*b* may comprise fan-out wiring and provide some of the horizontal interconnections for the packaged semiconductor devices 100 in some embodiments. The first interconnect structure 102*a* may also comprise other types of interconnect structures and may include other types of conductive features.

Referring next to FIG. 16, the plurality of first through-vias 110*a* that will be coupled between the first interconnect structure 102*a* and the second interconnect structure 102*b* is formed over the first interconnect structure 102*a*. Conductive vias 176*a* or other conductive features of the first interconnect structure 102*a* couple the plurality of first through-vias 110*a* to portions of conductive lines 174*a* or other conductive features of the first interconnect structure 102*a*. The plurality of first through-vias 110*a* provide some vertical interconnections for the packaged semiconductor device 100 in some embodiments.

The material of the conductive lines 174*a* and conductive vias 176*a* of the first interconnect structure 102*a* and/or the plurality of first through-vias 110*a* comprises a conductive material. The conductive material may comprise a metal, such as copper, titanium, tungsten, aluminum, alloys or multiple layers thereof, or the like. The conductive material may be formed by a plating process, such as electroplating or electro-less plating, or the like. The conductive material may be plated through a patterned layer of photoresist (not shown; see the layer of photoresist 188 shown in FIG. 25) in some embodiments, for example. The conductive material of the conductive lines 174*a* and conductive vias 176*a* of the first interconnect structure 102*a* and/or the plurality of first through-vias 110*a* may also be formed using subtractive etch techniques, by forming a conductive material over the carrier 170, and patterning the conductive material using a lithography process. Single or dual damascene methods may also be used to form the conductive lines 174*a* and conductive vias 176*a* of the first interconnect structure 102*a* and/or the plurality of first through-vias 110*a*, as another example. The conductive lines 174*a* and conductive vias 176*a* of the first interconnect structure 102*a* and/or the plurality of first through-vias 110*a* may also comprise other materials and be formed using other methods.

The insulating material layer or layers 178*a* shown in FIGS. 15 and 16 of the first interconnect structure 102*a* are formed around the conductive lines 174*a* in the conductive line layers and conductive vias 176*a* in the via layers of the first interconnect structure 102*a*. The insulating material layer(s) 178*a* may comprise a polymer, such as PBO, polyimide, BCB, or the like. In some embodiments, the insulating material layer(s) 178*a* may comprise a nitride such as silicon nitride; an oxide such as silicon oxide, PSG, borosilicate glass (BSG), BPSG; combinations or multiple layers thereof; or the like. The insulating material layer(s) 178*a* may be formed by any acceptable deposition process, such as spin coating, CVD, laminating, the like, or a combination thereof.

The plurality of first integrated circuit dies 104*a* and 104*b* is then coupled to the first interconnect structure 102*a* using an adhesive 106, as shown in FIG. 17. In some embodiments, one first integrated circuit die 104 (not shown in FIG. 17; see FIG. 39) is coupled to the first interconnect structure 102*a*. In some embodiments, two or more first integrated circuit dies 104*a* and 104*b* are coupled to the first interconnect structure 102*a*.

The plurality of second through-vias 110*b* has already been formed on the contact pads 108 of the plurality of first integrated circuit dies 104*a* and 104*b* in some of the embodiments shown in FIG. 17. For example, the plurality of second through-vias 110*b* may be formed on the plurality of first integrated circuit dies 104*a* and 104*b* when the plurality of first integrated circuit dies 104*a* and 104*b* are still in wafer form, and the plurality of first integrated circuit dies 104*a* and 104*b* are then singulated and attached to the first interconnect structure 102*a*. The plurality of second through-vias 110*b* provide some vertical interconnections for the packaged semiconductor device 100 in some embodiments.

The plurality of first integrated circuit dies 104*a* and 104*b* may be coupled to the first interconnect structure 102*a* using the adhesive 106 manually or using a pick-and-place machine. The plurality of first integrated circuit dies 104*a* and 104*b* may be coupled between a plurality of the first through-vias 110*a* in some embodiments, as illustrated in FIG. 17. The plurality of first integrated circuit dies 104*a* and 104*b* may also be coupled to the first interconnect structure 110*a* in other locations, such as in an edge or corner of the first interconnect structure 110*a*, not shown. One or more first integrated circuit dies 104*a* may be coupled to the first interconnect structure 110*a* within a single packaged semiconductor device 100 in accordance with some embodiments.

One or more second integrated circuit dies 114 is then coupled or disposed over the plurality of first integrated circuit dies 104*a* and 104*b*, as illustrated in FIG. 18. One second integrated circuit die 114 is shown in FIG. 18: two or more second integrated circuit dies 114 may also be coupled to a top surface of the plurality of first integrated circuit dies 104*a* and 104*b* in accordance with some embodiments. The second integrated circuit die 114 may be coupled to the plurality of first integrated circuit dies 104*a* and 104*b* using an adhesive 106 manually or using a pick-and-place machine. The second integrated circuit die(s) 114 may comprise contact pads 116 disposed proximate a top surface thereof. An insulating material layer 138 may be disposed over a surface of the second integrated circuit die(s) 114. In some embodiments, a conductive pillar 146 is coupled to the contact pads 116 of the second integrated circuit die(s) 114. In some embodiments, the conductive pillars 146 are not included on the second integrated circuit die(s) 114.

Figure 19:
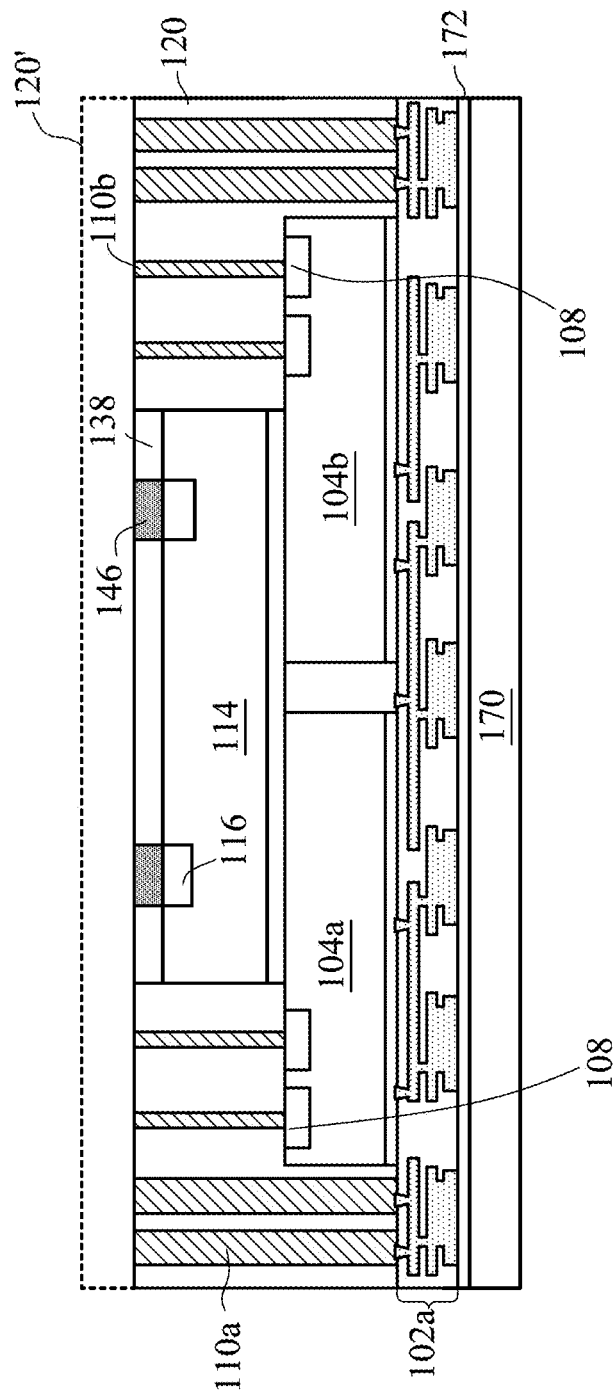

Referring next to FIG. 19, a molding material 120 is disposed over and around the plurality of first through-vias 110*a*, the plurality of second through-vias 110*b*, the plurality of first integrated circuit dies 104*a* and 104*b*, and the second integrated circuit die(s) 114. The molding material 120 encapsulates the plurality of first through-vias 110*a*, the plurality of second through-vias 110*b*, the plurality of first integrated circuit dies 104*a* and 104*b*, and the second integrated circuit die(s) 114 in some embodiments, for example. The molding material 120 may comprise a molding compound comprised of an insulating material, such as an epoxy, a filler material, a stress release agent (SRA), an adhesion promoter, other materials, or combinations thereof, as examples. The molding material 120 may comprise a liquid or gel when applied so that it flows between and around the plurality of first through-vias 110*a*, the plurality of second through-vias 110*b*, the plurality of first integrated circuit dies 104*a* and 104*b*, and the second integrated circuit die(s) 114, in some embodiments. The molding material 120 is then cured or allowed to dry so that it forms a solid. A molding compound clamp may be applied during a curing process and a plasma treatment process of the molding material 120 in some embodiments. In some embodiments, as deposited, the molding material 120 extends over top surfaces of the plurality of first through-vias 110*a*, the plurality of second through-vias 110*b*, the plurality of first integrated circuit dies 104*a* and 104*b*, and the second integrated circuit die(s) 114, as illustrated in phantom (e.g., in dashed lines) in FIG. 19 at 120'. Other methods may also be used to form the molding material 120.

After the molding material 120 is applied, a top portion of the molding material 120 is removed using a planarization process, such as a CMP process, a grinding process, an etch process, or combinations thereof in some embodiments, as examples. Other methods may also be used to planarize the molding material 120. A top portion of the plurality of first through-vias 110*a*, the plurality of second through-vias 110*b*, the plurality of first integrated circuit dies 104*a* and 104*b*, and the second integrated circuit die(s) 114 may also be removed during the planarization process for the molding material 120. In some embodiments, an amount of the molding material 120 applied may be controlled so that top surfaces of the plurality of first through-vias 110*a*, the plurality of second through-vias 110*b*, the plurality of first integrated circuit dies 104*a* and 104*b*, and the second integrated circuit die(s) 114 are exposed, so that a planarization process for the molding material 120 is not required.

Figure 20:
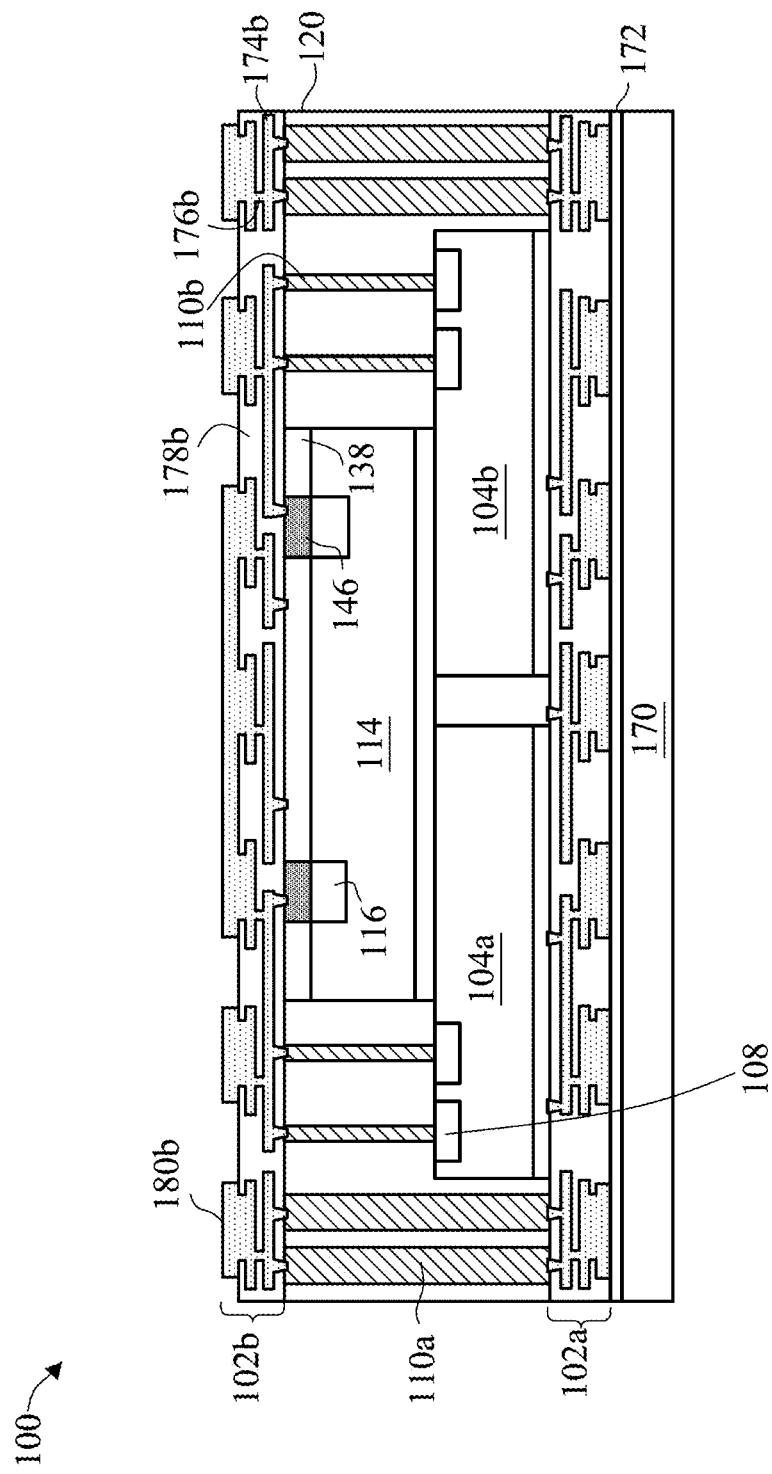

Next, a second interconnect structure 102*b* is formed over the molding material 120, the plurality of first through-vias 110*a*, the plurality of second through-vias 110*b*, the plurality of first integrated circuit dies 104*a* and 104*b*, and the second integrated circuit die(s) 114, as shown in FIG. 20. The second interconnect structure 102*b* may comprise a front side interconnect structure, for example. The second interconnect structure 102*b* may comprise a PPI structure in some embodiments. The second interconnect structure 102*b* comprises an RDL comprising fan-out wiring in some embodiments.

One or more conductive material layers and insulating material layers of the second interconnect structure 102*b* are sequentially formed over the molding material 120, the plurality of first through-vias 110*a*, the plurality of second through-vias 110*b*, the plurality of first integrated circuit dies 104*a* and 104*b*, and the second integrated circuit die(s) 114 in some embodiments. For example, the second interconnect structure 102*b* may be formed over the planarized molding material 120, the plurality of first through-vias 110*a*, the plurality of second through-vias 110*b*, the plurality of first integrated circuit dies 104*a* and 104*b*, and the second integrated circuit die(s) 114. The second interconnect structure 102*b* may comprise one or more conductive line 174*b* layers and one or more conductive via 176*b* layers disposed in one or more insulating material layers 178*b*.

Conductive lines 174*b* and conductive vias 176*b* of the second interconnect structure 102*b* may comprise similar materials and formation methods as described for conductive lines 174*a* and conductive vias 176*a* of the first interconnect structure 102*a* in some embodiments. The conductive lines 174*b* and conductive vias 176*b* of the second interconnect structure 102*b* may comprise fan-out wiring and may provide some of the horizontal interconnections for the packaged semiconductor device 100 in some embodiments. The second interconnect structure 102*b* may also comprise other types of interconnect structures. Likewise, insulating material layers 178*b* may comprise similar materials and formation methods as described for insulating material layer(s) 178*a* of the first interconnect structure 102*a*.

The second interconnect structure 102*b* may include an underball metallization (UBM) structure 180*b* formed within and over an upper insulating material layer 178*b* proximate a top surface of the second interconnect structure 102*b*. The UBM structure 180*b* includes a conductive material layer that may extend within openings formed in insulating material layer 178*b* over portions of conductive lines 174*b*. The UBM structure 180*b* may comprise similar materials and formation methods as described for the conductive line 174*a* and conductive vias 176*b* of the first interconnect structure 102*a* in some embodiments. The UBM structure 180*b* comprises mounting regions for connectors 130 (see FIG. 22), for example. Note that the first interconnect structure 102*a* may also include a UBM structure 180*b* proximate a bottom surface thereof, not labelled in the drawings.

In some embodiments, the packaging process is completed at the packaging stage shown in the cross-sectional view of FIG. 20. The carrier 170 and film 172 are removed, and a plurality of the packaged semiconductor devices 100 are separated from another by singulating the second interconnect structure 102*b*, the molding material 120, and the first interconnect structure 102*a*, forming a plurality of packaged semiconductor devices 100. The packaged semiconductor devices 100 may be utilized in an end application, with other devices, or other packaged semiconductor device 100 by making electrical connections to the UBM structure of the second interconnect structure 102*b* and/or to the UBM structure of the first interconnect structure 102*a*. For example, connectors on another device (not shown) or another packaged semiconductor device may be used to connect to the second interconnect structure 102*b* or the first interconnect structure 102*a* in some embodiments.

Figure 21:
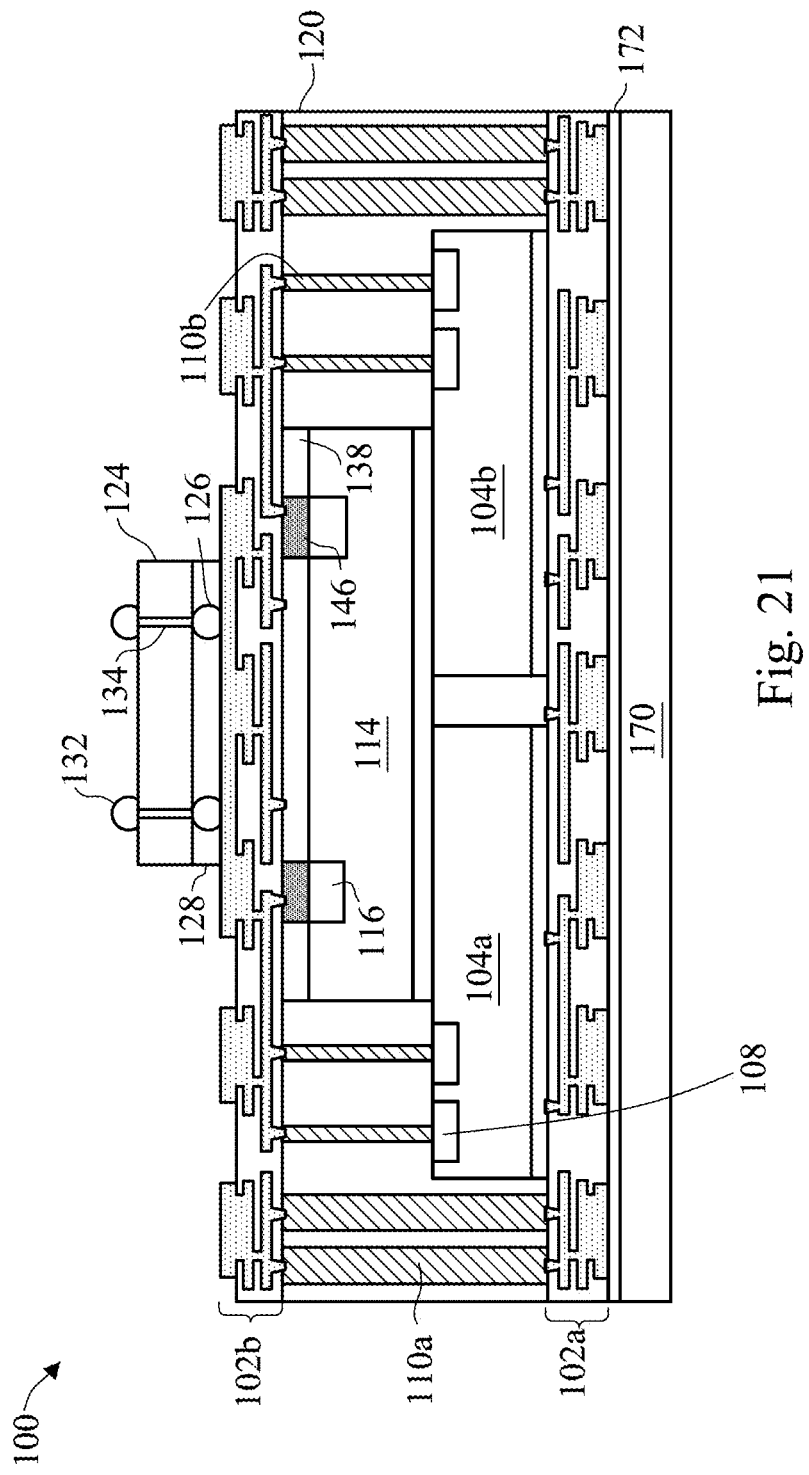

In some embodiments, after the packaging step illustrated in FIG. 20, a third integrated circuit die or passive device 124 is then coupled to the second interconnect structure 102*b*, as shown in FIG. 21. A plurality of the packaged semiconductor devices 100 may then be singulated, as described for FIG. 20.

Figure 22:
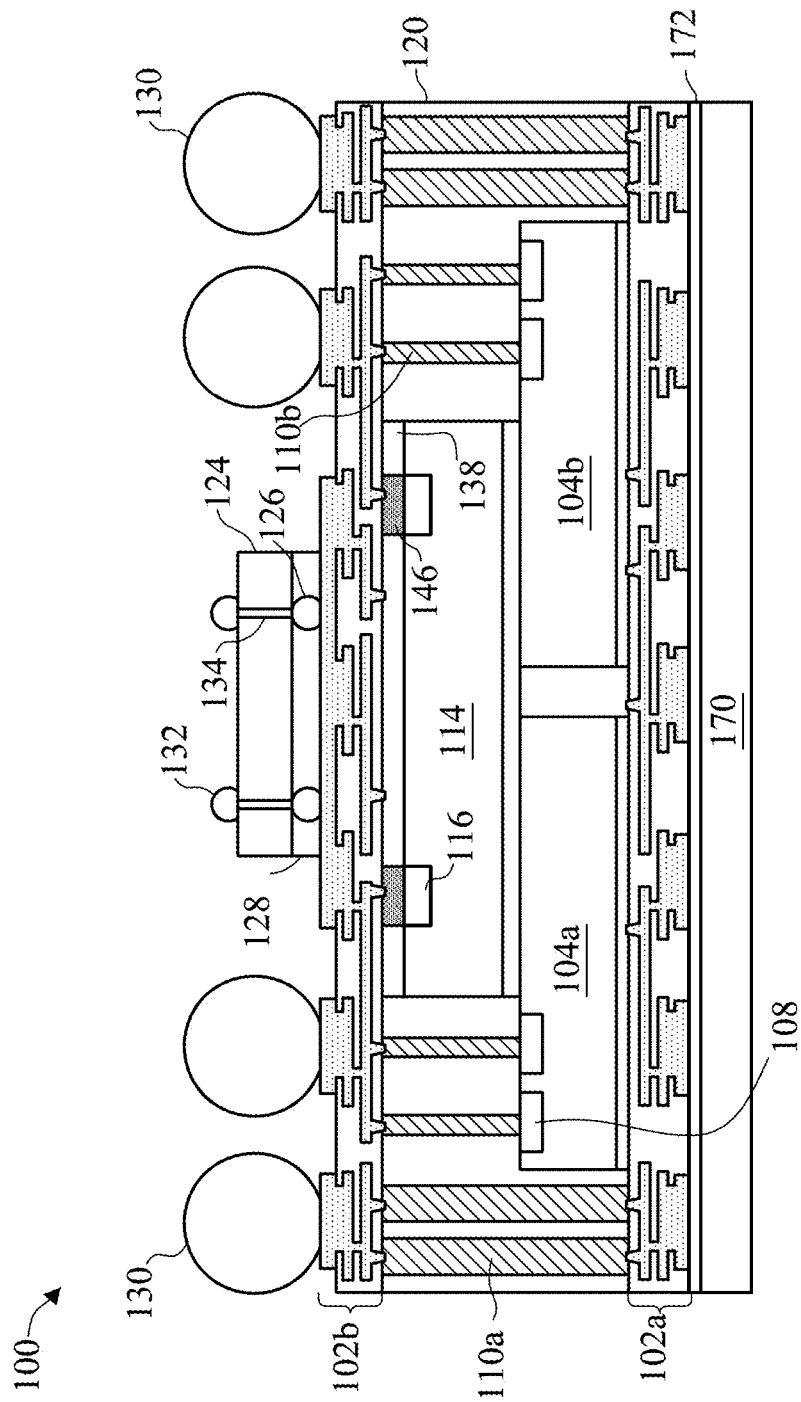

In some embodiments, a plurality of connectors 130 are coupled to the UBM structure 180*b*, as shown in FIG. 22. The connectors 130 may comprise solder bumps, solder balls, or other types of connectors 130. The connectors 130 may be formed using a ball mount process or other process, for example. The connectors 130 may comprise a eutectic material, for example. The eutectic material may comprise a re-flowable conductive material such as solder, for example. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder materials may also include tin and silver, Sn—Ag, without the use of copper. The connectors 130 may also include conductive pillars or bumps, for example.

The plurality of connectors 130 may be arranged in rows and columns on the packaged semiconductor devices 100 or in predetermined locations on the packaged semiconductor devices 100, such as along the edges or perimeter. In some embodiments, the connectors 130 are not included. After attachment of the connectors 130 to the second RDL 102*b* as shown in FIG. 22, the carrier 170 and film 172 are removed as shown in FIG. 1, and a plurality of the packaged semiconductor devices 100 are singulated, as described for FIG. 20.

Figure 23:
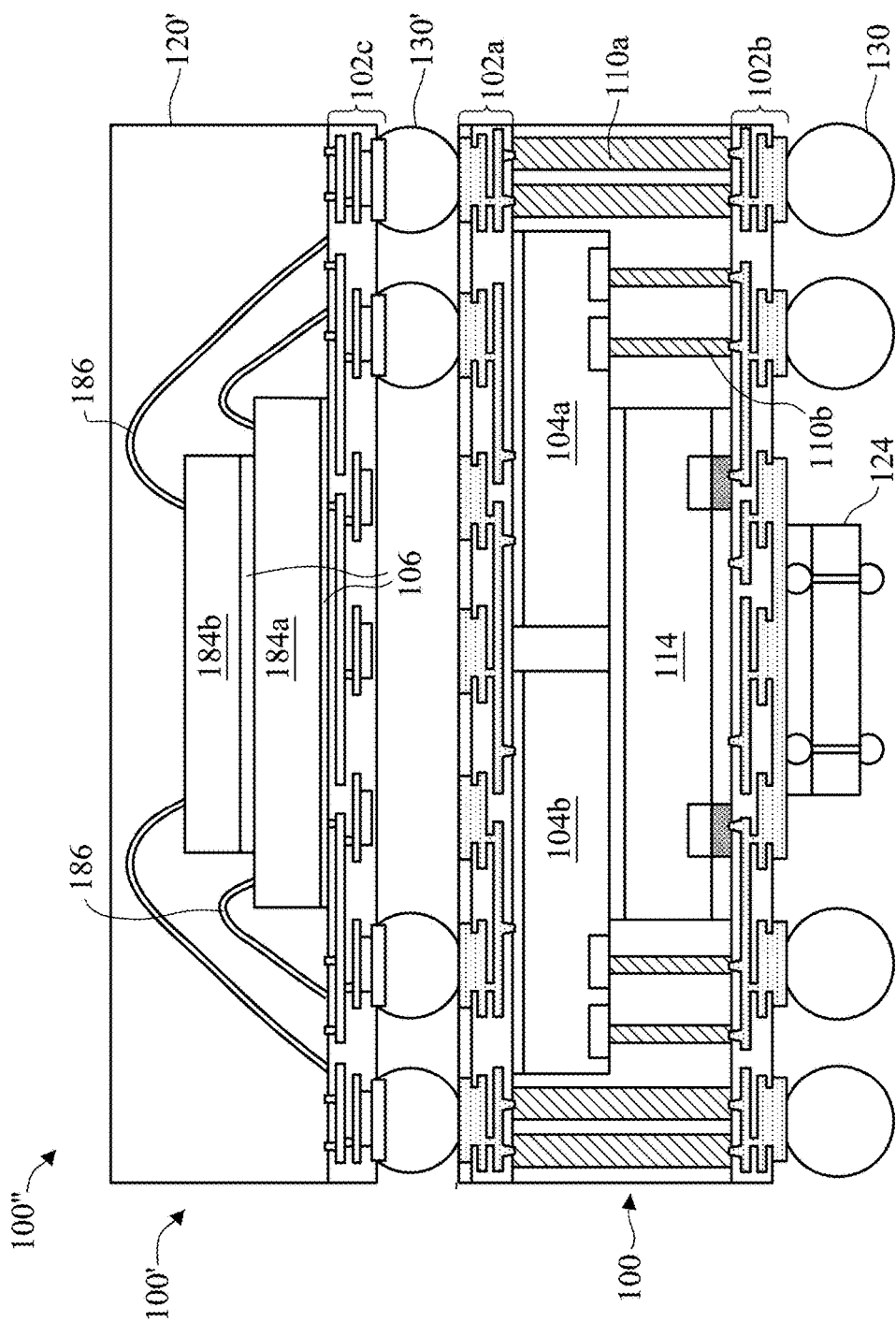
FIG. 23 is a cross-sectional view of a package-on-package (PoP) device in accordance with some embodiments of the present disclosure.

FIG. 23 is a cross-sectional view of a package-on-package (PoP) device 100" in accordance with some embodiments of the present disclosure. A packaged semiconductor device 100 described herein and shown in FIG. 1 has been inverted in the view shown. The packaged semiconductor device 100 comprises a first packaged semiconductor device 100 in some embodiments, for example. The PoP device 100" includes a second packaged semiconductor device 100' that is coupled to the first interconnect structure 102*a* by a plurality of connectors 130'. The connectors 130' may comprise similar materials as described for connectors 130, for example.

The second packaged semiconductor device 100' may comprise one or more packaged integrated circuit dies 184*a* and/or 184*b*, for example. In some of the embodiments illustrated in FIG. 23, the second packaged semiconductor device 100' includes two integrated circuit dies 184*a* and 184*b* that are stacked vertically. Integrated circuit die 184*a* is coupled to an interconnect structure 102*c* that may comprise similar materials as described for the first and second interconnect structures 102*a* and 102*b*, for example. Integrated circuit die 184*a* is attached to the interconnect structure 102*c* using an adhesive 106, and integrated circuit die 184*b* is attached to integrated circuit die 184*a* using an adhesive 106. Bond wires 186 are coupled between contact pads of the integrated circuit dies 184*a* and 184*b* and contact pads of the interconnect structure 102*c*. A molding material 120' that may comprise similar materials and formation methods as described for molding material 120 may be disposed over the integrated circuit dies 184*a* and 184*b*, the bond wires 186, and the interconnect structure 102*c*. The packaged semiconductor devices 100 described herein may also be coupled to other types of packaged semiconductor devices to form a PoP device 100".

Figure 24:
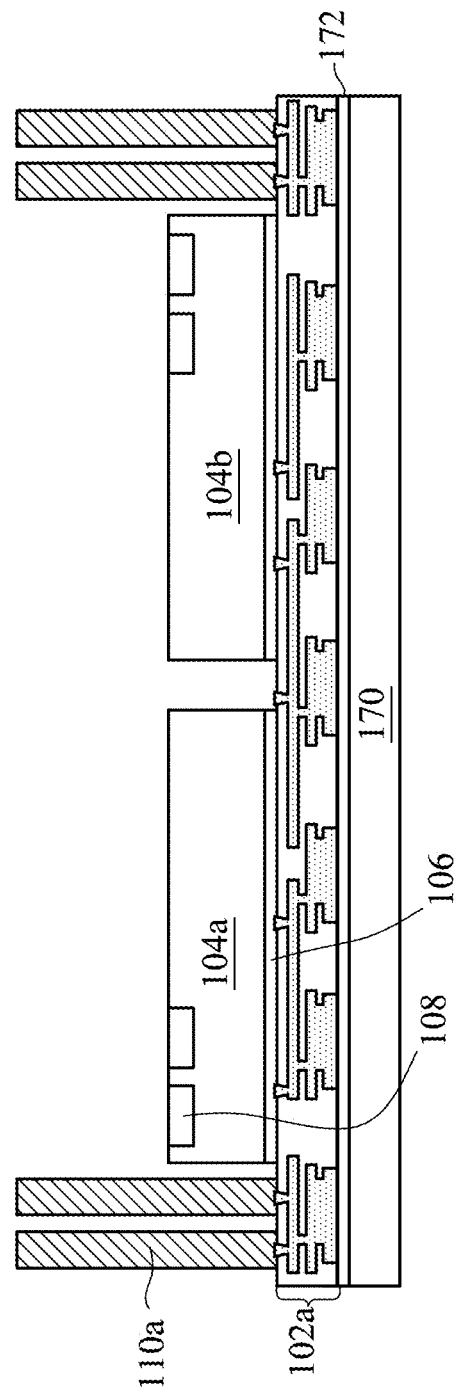
FIGS. 24 through 26 are cross-sectional views illustrating a method of packaging semiconductor devices at various stages in accordance with some embodiments.
Figure 25:
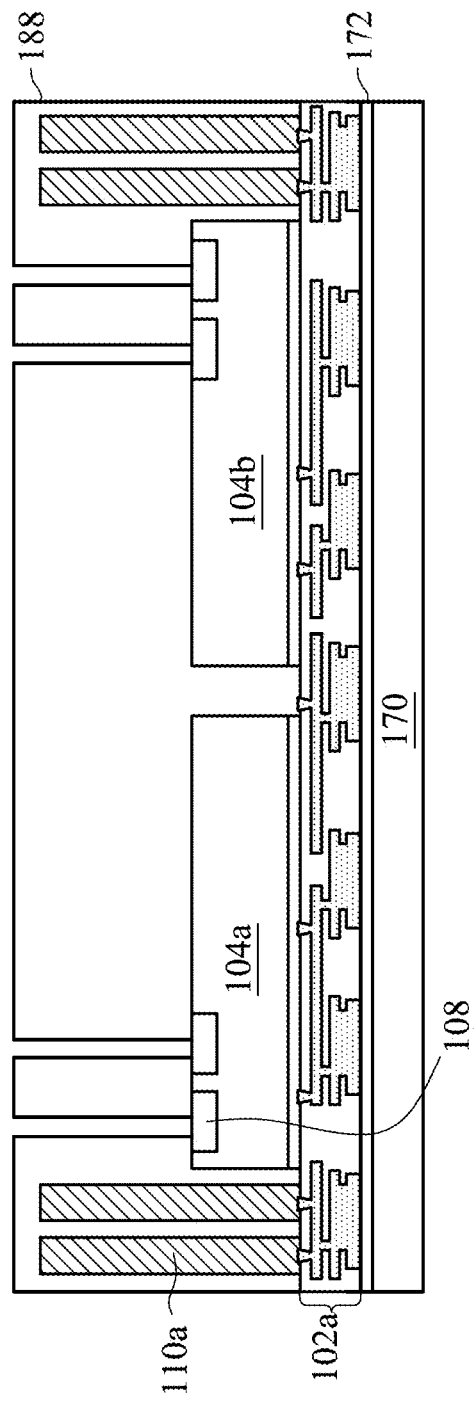
Figure 26:
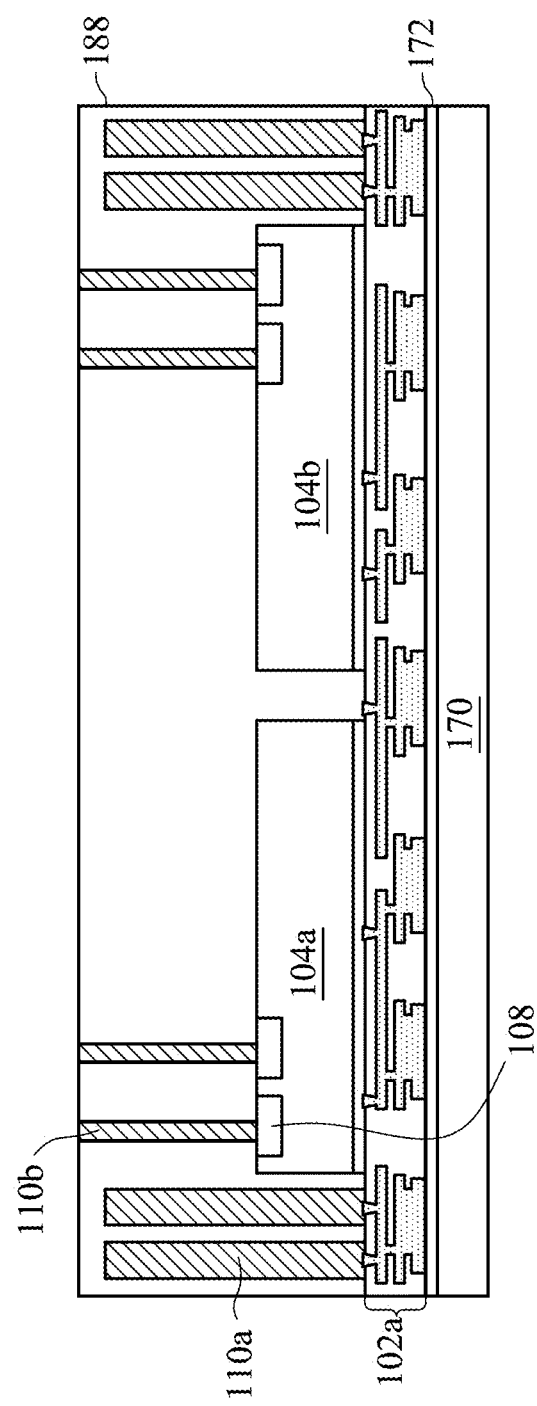

FIGS. 24 through 26 are cross-sectional views illustrating a method of packaging semiconductor devices at various stages in accordance with some embodiments. After the packaging process step illustrated in FIG. 16, a plurality of first integrated circuit dies 104*a* and 104*b* is coupled to the first interconnect structure 102*a* using an adhesive 106. The plurality of first integrated circuit dies 104*a* and 104*b* does not include second through-vias formed thereon. A plurality of second through-vias 110*b* is then formed on the plurality of first integrated circuit dies 104*a* and 104*b* using a plating process, as shown in FIGS. 25 and 26. In FIG. 25, a layer of photoresist 188 is deposited or formed over the plurality of first integrated circuit dies 104a and 104b, the plurality of first through-vias 110a, and the first interconnect structure 102a. The layer of photoresist 188 is patterned using a photolithography process, for example, by exposing the layer of photoresist 188 to light or energy reflected from or transmitted through a lithography mask having a desired pattern thereon. The layer of photoresist 188 is then developed, and exposed or unexposed portions of the layer of photoresist 188 are removed, depending on whether the layer of photoresist 188 comprises a positive or negative photoresist. A conductive material of the plurality of second through-vias 110b is then plated onto the contact pads 108 of the plurality of first integrated circuit dies 104a and 104b using a plating process, as shown in FIG. 26. The plating process may comprise using electrochemical plating (ECP) or other plating techniques. The layer of photoresist 188 is removed, and the packaging process is then continued as shown and described with reference to FIGS. 17 through 20. The packaging process may also continue as shown and described with reference to FIGS. 21, 22, and/or 23.

Figure 27:
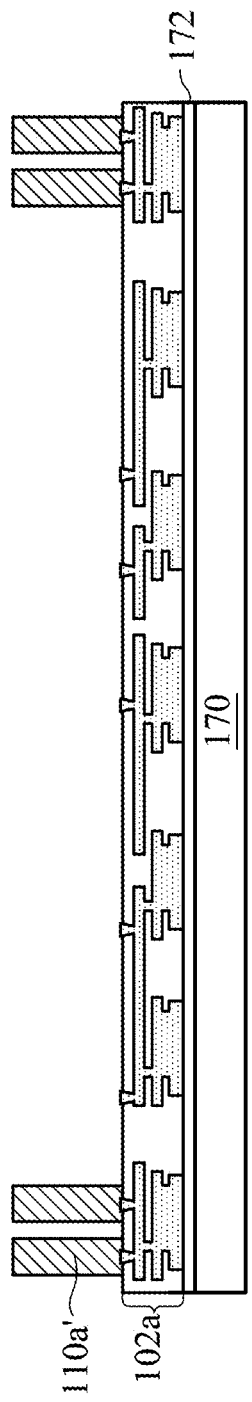
Figure 28:
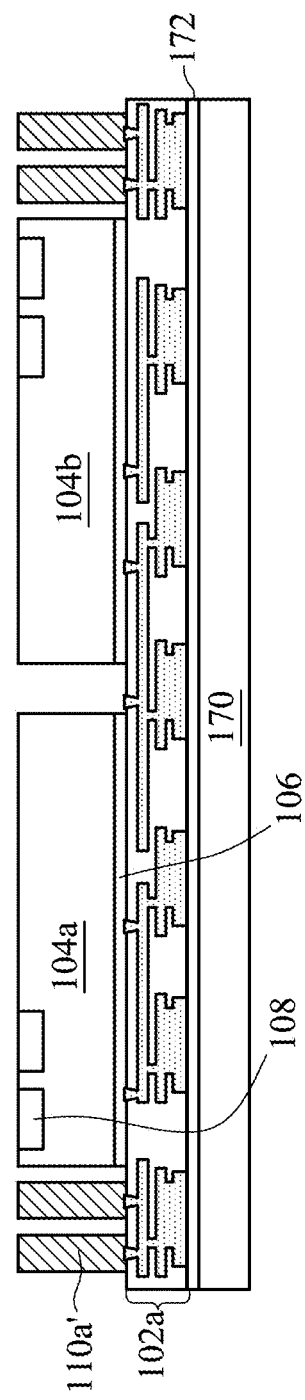
Figure 29:
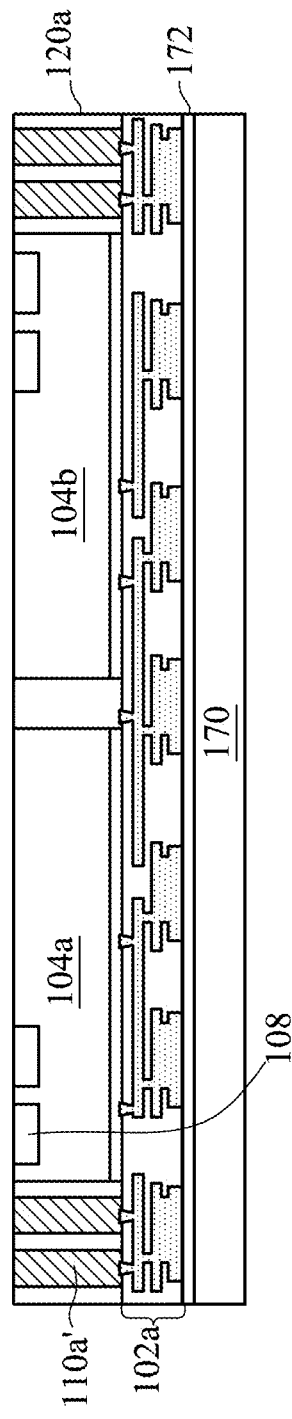

FIGS. 27 through 32 are cross-sectional views illustrating a method of packaging semiconductor devices at various stages in accordance with some embodiments. The first through-vias 110a are formed in a two-step process, and the molding material 120 comprises two layers 120a and 120b. After the first interconnect structure 102a is formed over the carrier 170 as shown in FIG. 15, a first portion 110a' of the first through-vias 110a are formed, as shown in FIG. 27. The first portion 110a' of the first through-vias 110a may be formed using a plating process, damascene process, or subtractive etch process, as examples. The plurality of first integrated circuit dies 104a and 104b is coupled to the first interconnect structure 102a using an adhesive 106, as shown in FIG. 28. A first layer 120a of the molding material 120 is formed between the first portion 110a' of the first through-vias 110 and the plurality of first integrated circuit dies 104a and 104b, as shown in FIG. 29. Excess portions of the first layer 120a of the molding material 120 may be removed using a planarization process.

Figure 30:
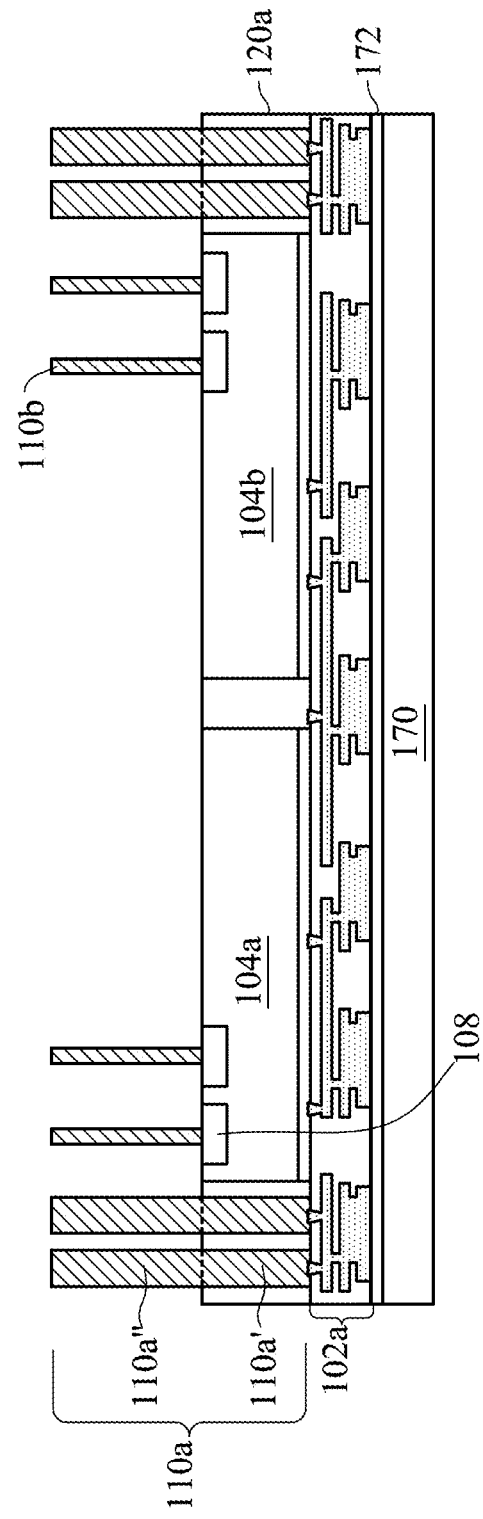

A second portion 110a" of the first through-vias 110a and the second through-vias 110b are formed, as shown in FIG. 30. The second portion 110a" of the first through-vias 110a and the second through-vias 110b may be formed simultaneously using a single plating process, damascene process, subtractive etch process, or other methods in some embodiments, as examples. The plurality of first through-vias 110a each comprise a lower first portion 110a' and an upper second portion 110a" in the view shown in FIG. 30, for example. A second integrated circuit die 114 is then coupled to the plurality of first integrated circuit dies 104a and 104b and to the first layer 120a of the molding material 120 using an adhesive 106, as shown in FIG. 31. A second layer 120b of the molding material 120 is formed over the first layer 120a of the molding material 120, the plurality of first through-vias 110a, the plurality of second through-vias 110b, and the second integrated circuit die 114. The second layer 120b of the molding material 120 may be planarized as described for the molding material 120 shown in FIG. 19. The packaging process is then continued as shown and described with reference to FIG. 20. The packaging process may also continue as shown and described with reference to FIGS. 21, 22, and/or 23.

FIGS. 33 through 38 are cross-sectional views illustrating a method of packaging semiconductor devices at various stages in accordance with some embodiments. A method of packaging three integrated circuit die layers as shown in FIGS. 8A, 8B, 9A, and 9B is illustrated at various stages.

Figure 33:
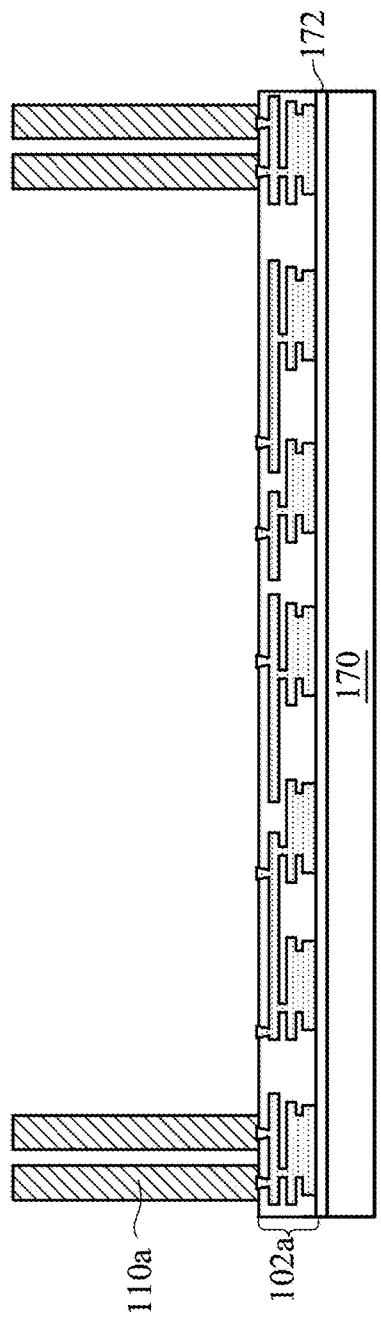
FIGS. 33 through 38 are cross-sectional views illustrating a method of packaging semiconductor devices at various stages in accordance with some embodiments.

After the first interconnect structure 102a is formed over the carrier 170 as shown in FIG. 15, the plurality of first through-vias 110a is formed over the first interconnect structure 102a as shown in FIG. 33. The plurality of first through-vias 110a are longer (e.g., taller) than illustrated in FIGS. 16, 24, and 30 in some embodiments to accommodate for a thickness of three layers of integrated circuit dies, for example.

Figure 34:
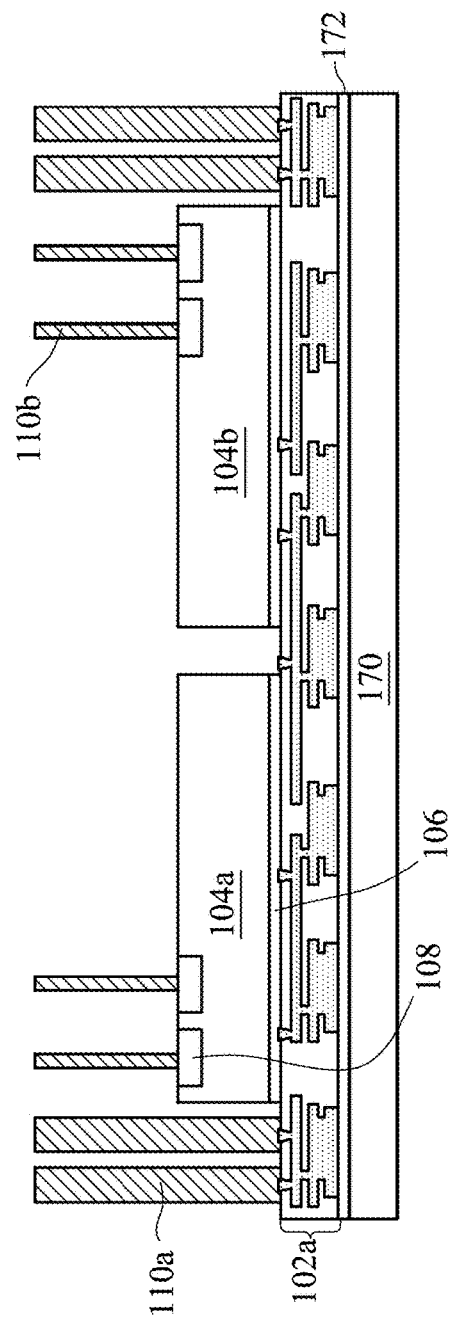

In FIG. 34, a plurality of first integrated circuit dies 104a and 104b is coupled to the first interconnect structure 102a. Either the plurality of first integrated circuit dies 104a and 104b has the plurality of second through-vias 110b formed thereon, or the plurality of second through-vias 110b is then formed over the plurality of first integrated circuit dies 104a and 104b coupled to the contact pads 108.

Figure 35:
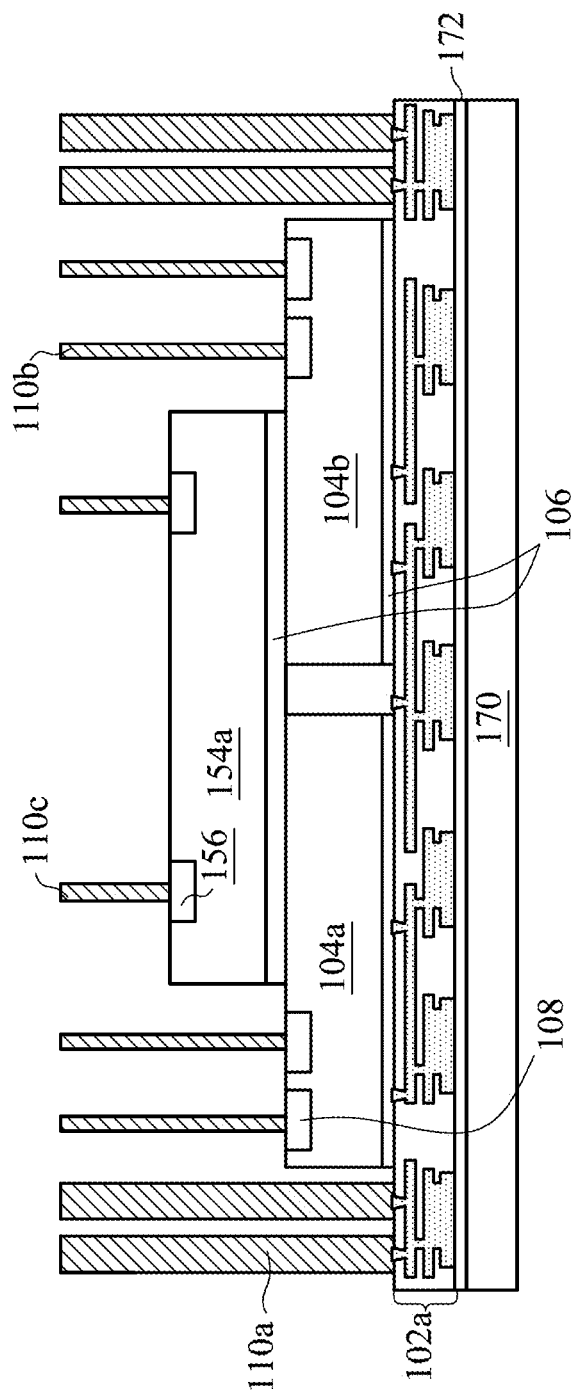

In FIG. 35, a plurality of third integrated circuit dies 154a and 154b (third integrated circuit die 154b is not shown in FIG. 35; see FIG. 8B) is coupled to the plurality of first integrated circuit dies 104a and 104b. Either the plurality of third integrated circuit dies 154a and 154b has the plurality of third through-vias 110c formed thereon, or the plurality of third through-vias 110c is then formed over the plurality of third integrated circuit dies 154a and 154b coupled to the contact pads 156.

Figure 36:
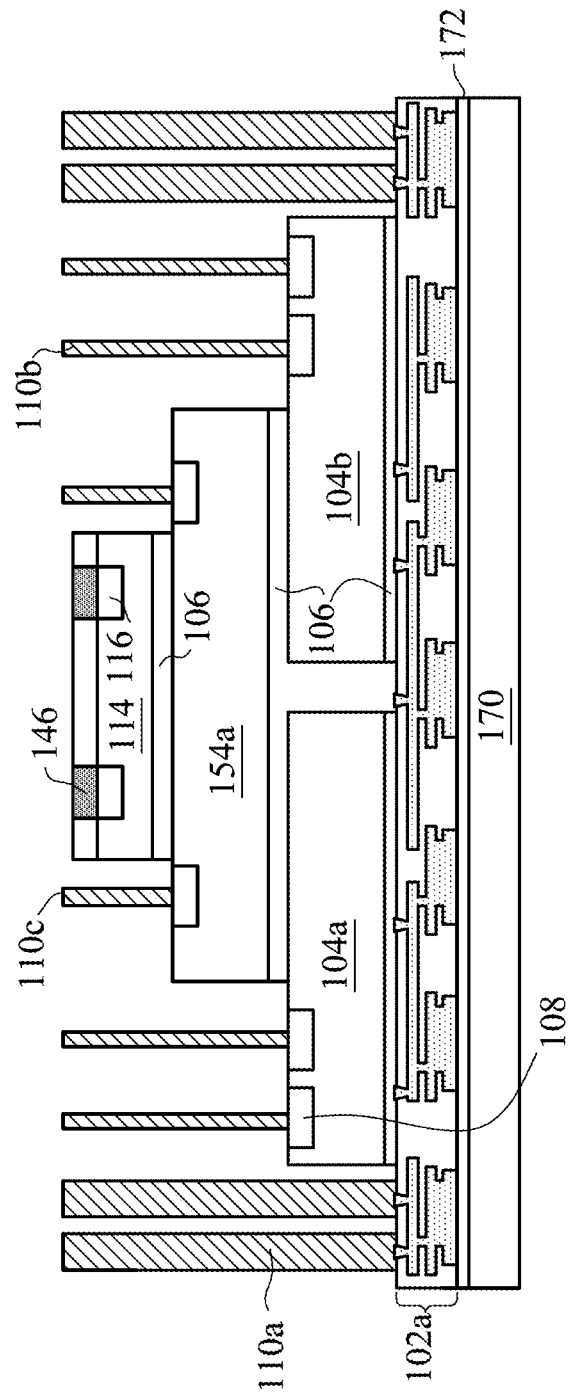
Figure 37:
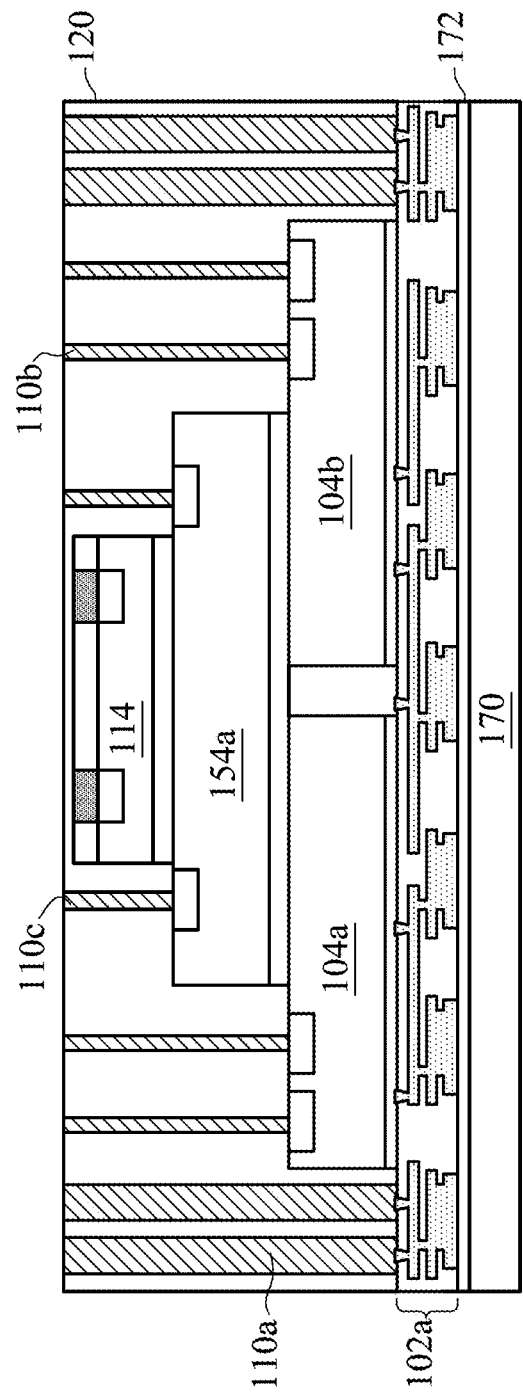
Figure 38:
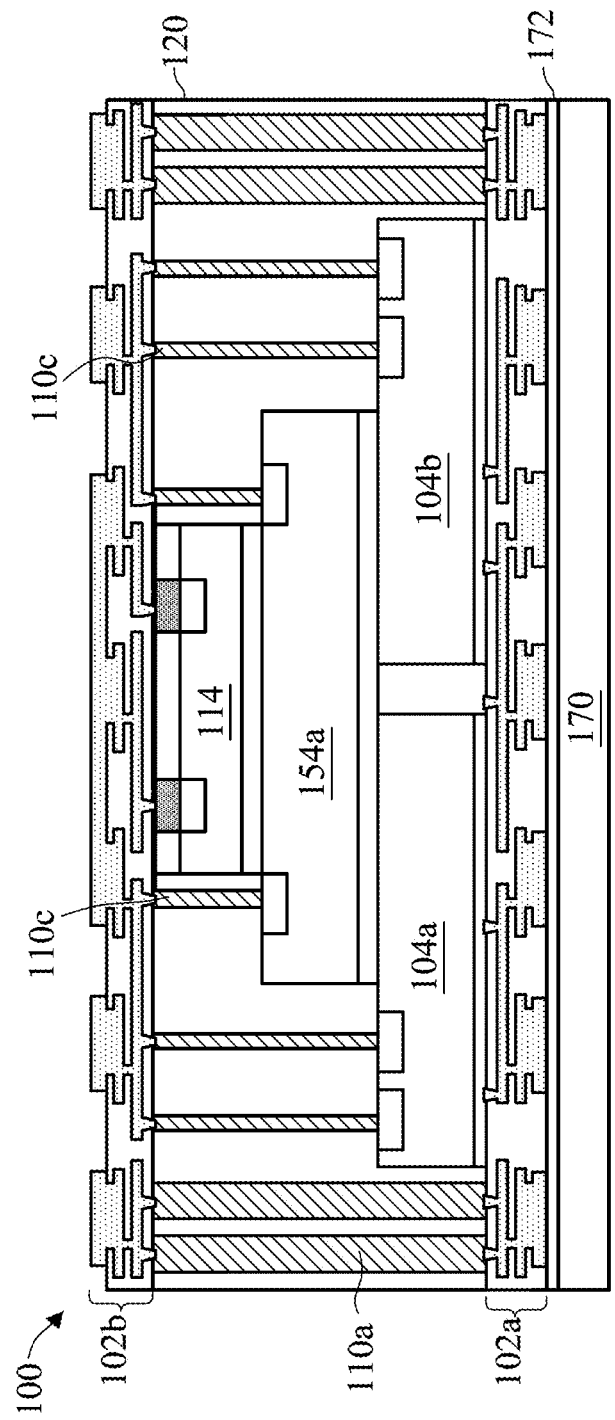

In FIG. 36, a second integrated circuit die 114 is coupled to the plurality of third integrated circuit dies 154a and 154b, and in FIG. 37, the molding material 120 is applied and planarized. In FIG. 38, the second interconnect structure 102b is formed over the molding material 120, the second integrated circuit die 114, the plurality of first through-vias 110a, the plurality of second through-vias 110b, and the plurality of third through-vias 110c. The carrier 170 and film 172 may be removed, and the packaged semiconductor devices 100 may be singulated, in some embodiments. The packaging process may also continue as shown and described herein with reference to FIGS. 21, 22, and/or 23.

Figure 39:
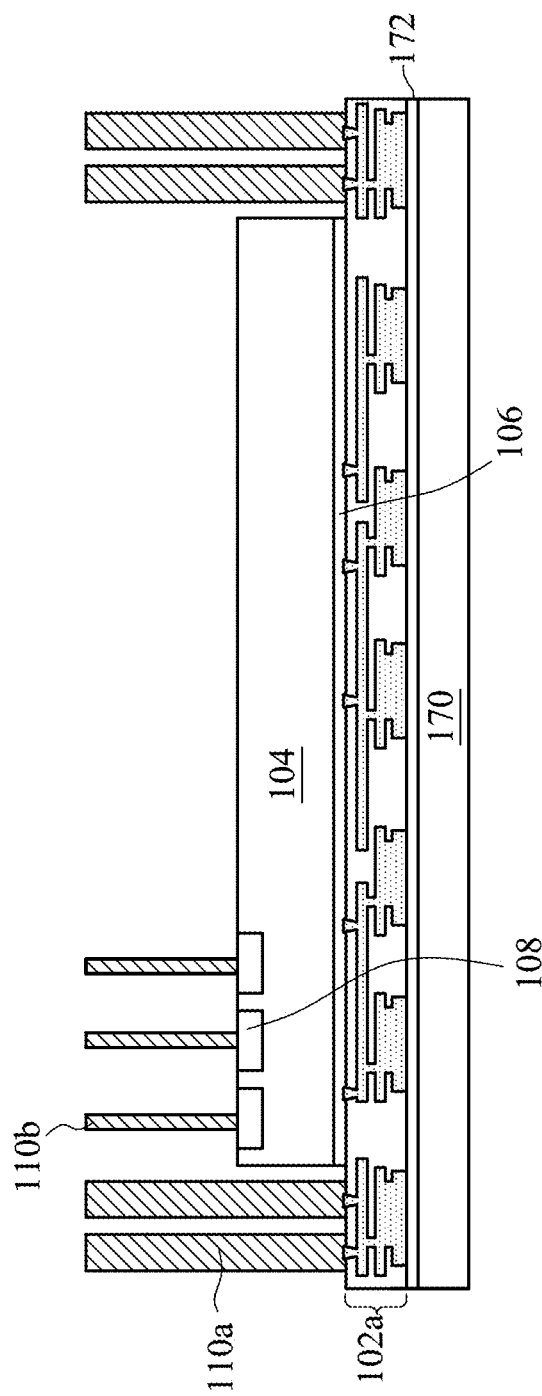
FIGS. 39 and 40 are cross-sectional views illustrating a method of packaging semiconductor devices at various stages in accordance with some embodiments.
Figure 40:
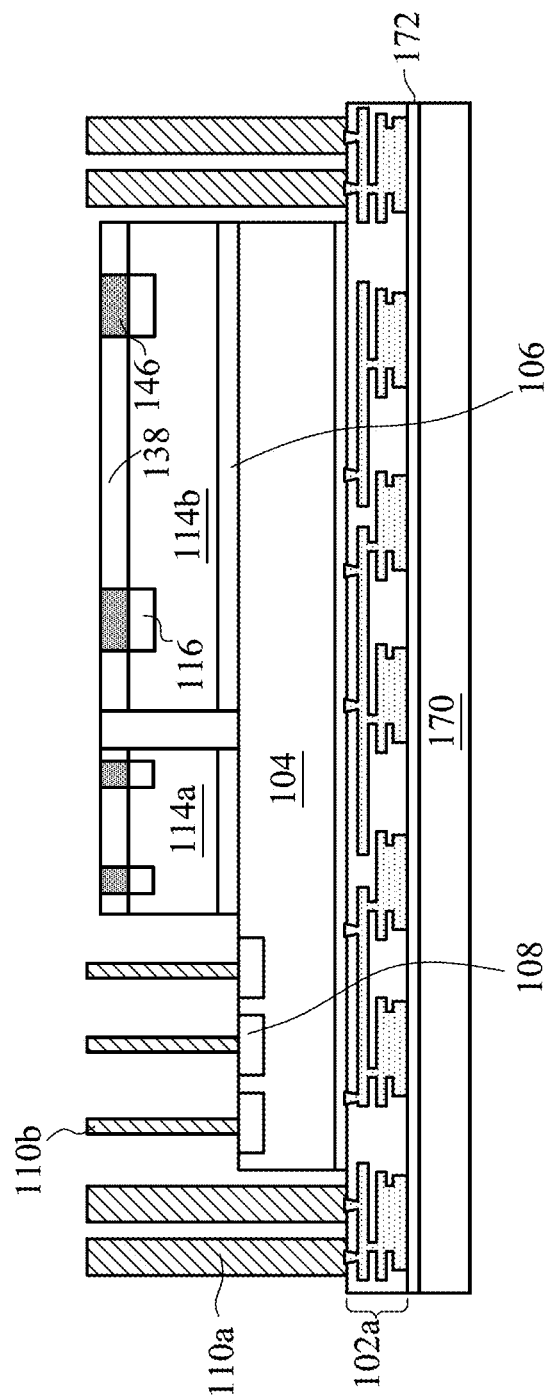

FIGS. 39 and 40 are cross-sectional views illustrating a method of packaging semiconductor devices at various stages in accordance with some embodiments. After the packaging process steps illustrated in FIG. 15 of forming the first interconnect structure 102a and in FIG. 16 of forming the plurality of first through-vias 110a, a first integrated circuit die 104 is coupled to the first interconnect structure 102a by an adhesive 106, as shown in FIG. 39. Either the first integrated circuit die 104 has the plurality of second through-vias 110b formed thereon, or the plurality of second through-vias 110b is then formed over the first integrated circuit die 104 coupled to the contact pads 108. A plurality of second integrated circuit dies 114a and 114b is coupled to the first integrated circuit die 104 by an adhesive 106, as shown in FIG. 40. The packaging process is then continued as described with reference to FIGS. 19 and 20. The packaging process may also continue as shown and described herein with reference to FIGS. 21, 22, and/or 23.

Figure 41:
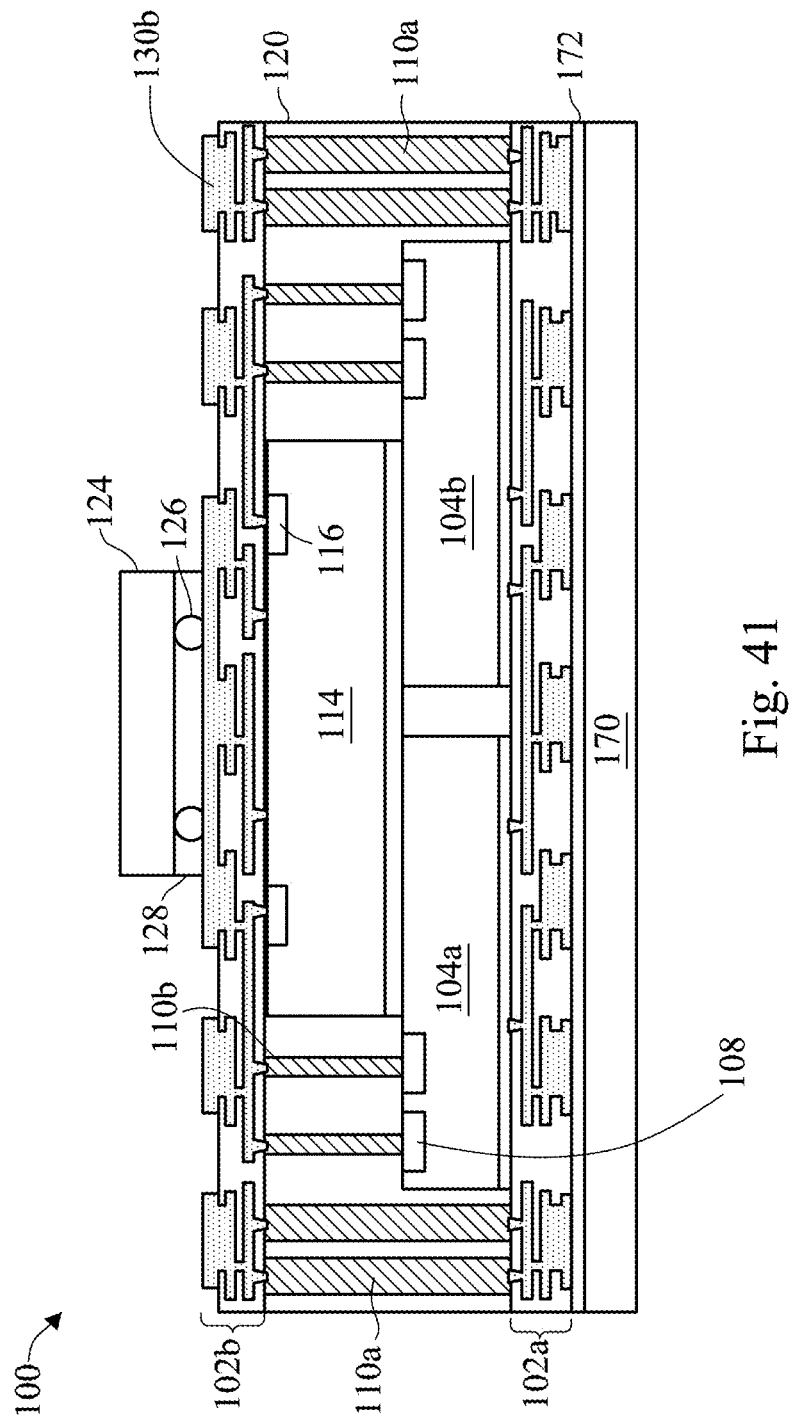
FIGS. 41 and 42 are cross-sectional views illustrating a method of packaging semiconductor devices at various stages in accordance with some embodiments.
Figure 42:
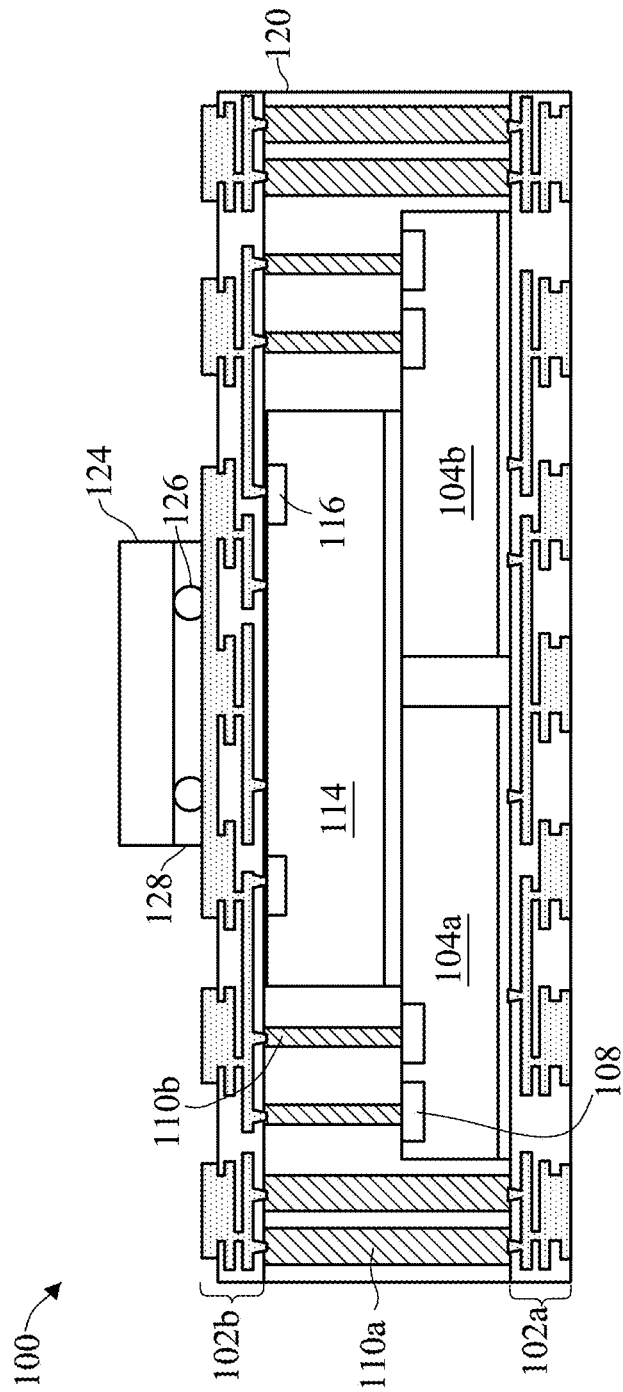

FIGS. 41 and 42 are cross-sectional views illustrating a method of packaging semiconductor devices at various stages in accordance with some embodiments. After the packaging process shown in FIG. 20 wherein the second interconnect structure 102b is formed, a third integrated circuit die or passive device 124 may be coupled to the second interconnect structure 102b. The third integrated circuit die or passive device 124 does not include through-vias formed therein. The carrier 170 and film 172 are removed, as shown in FIG. 42. The packaged semiconductor devices 100 may then be singulated an implemented in an end application. In some embodiments, before the packaged semiconductor devices 100 are singulated, connectors 130 may be attached to the first interconnect structure 102a, as shown in FIG. 2.

The packaging process steps illustrated in FIGS. 41 and 42 may also be implemented for the other embodiments shown and described herein.

Note that contact pads 116 of the second integrated circuit die 114 are coupled directly to conductive features of the second interconnect structure 102b in some of the embodiments shown in FIG. 41. Likewise, contact pads 116 of the upper-most integrated circuit dies may also be directly to conductive features of the second interconnect structure 102b for the other embodiments shown and described herein.

Figure 43:
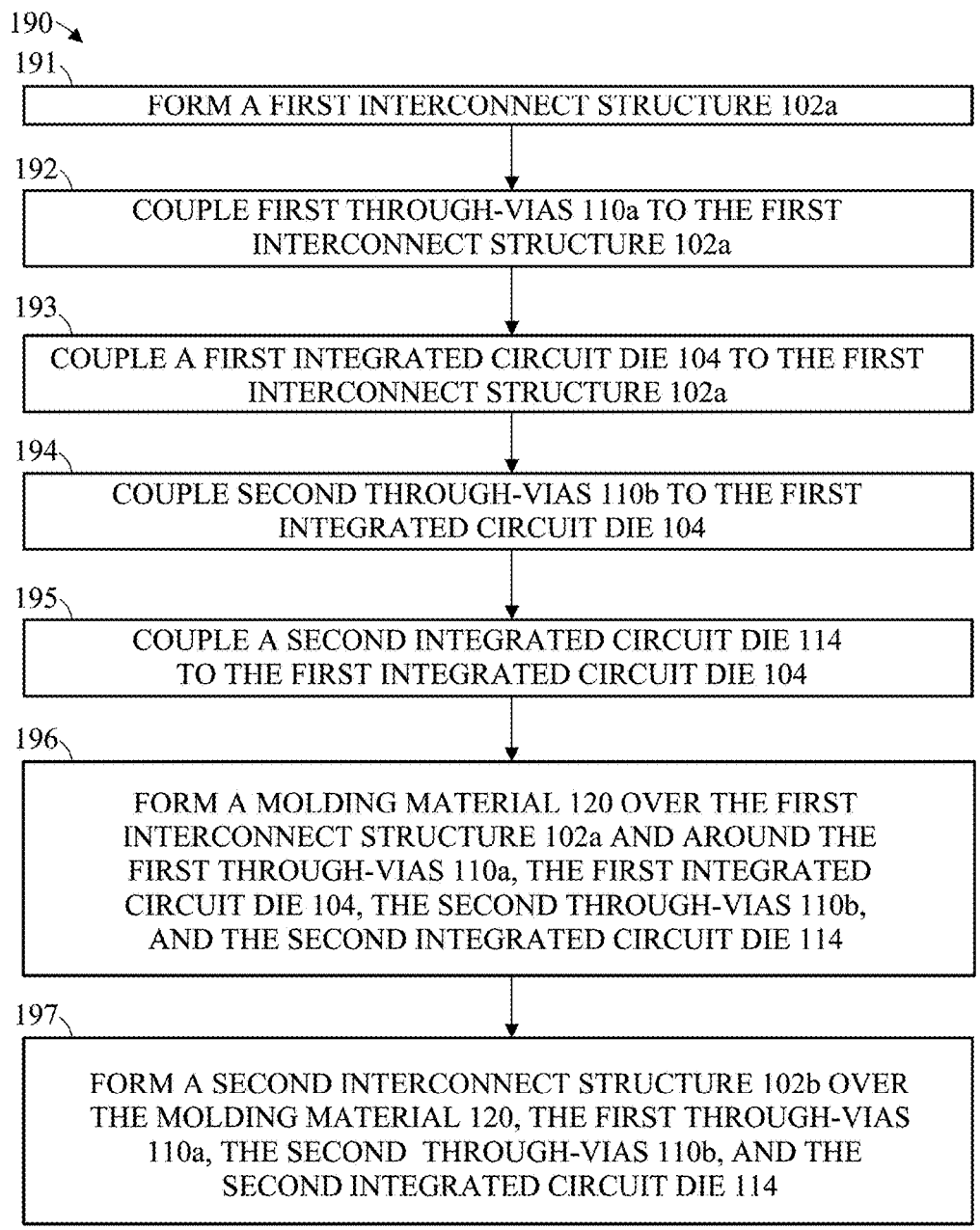
FIG. 43 is a flow chart that describes a method of packaging semiconductor devices in accordance with some embodiments.

FIG. 43 is a flow chart 190 that describes a method of packaging semiconductor devices in accordance with some embodiments. In step 191, a first interconnect structure 102a is formed (see also FIG. 15). In step 192, first through-vias 110a are coupled to the first interconnect structure 102a (see also FIG. 16). In step 193, a first integrated circuit die 104 is coupled to the first interconnect structure 102a (see also FIG. 24 at 104a or 104b or FIG. 39). In step 194, second through-vias 110b are coupled to the first integrated circuit die 104 (see also FIGS. 25 and 26 or FIG. 39). In step 195, a second integrated circuit die 114 is coupled to the first integrated circuit die 104 (FIG. 18). In step 196, a molding material 120 is formed over the first interconnect structure 102a and around the first through-vias 110a, the first integrated circuit die 104, the second through-vias 110b, and the second integrated circuit die 114 (FIG. 19). In step 197, a second interconnect structure 102b is formed over the molding material 120, the first through-vias 110a, the second through-vias 110b, and the second integrated circuit die 114 (FIG. 20).

In some embodiments, the first integrated circuit dies 104, 104a, and 104b described herein may comprise memory devices, the second integrated circuit dies 114, 114a, 114b, 114c, and 114d may comprise systems-on-chip (SOC) devices, and the third integrated circuit dies or passive devices 124 may comprise a capacitor, as an example. The third integrated circuit dies or passive devices 124 may also comprise other types of integrated passive devices (IPDs), memory devices, application specific integrated circuit (ASIC) devices, flip chip (FC) devices, hybrid bond devices, or surface mount devices (SMD), as examples. The various integrated circuit dies described herein may also comprise other types of devices adapted to perform other functions.

Some advantages of the present disclosure include providing packaging structures and packaging process flows with an extremely thin profile that integrate logic, memory, IPDs, and other devices. The packaged semiconductor devices are substrate-less, which provides a thin profile, for example. The packaged semiconductor devices may comprise SiP devices that have fast memory access and high memory capacity and bandwidth, as examples. The SiP devices may also be implemented in PoP devices.

In some embodiments, packaged semiconductor devices disclosed herein comprise SiP devices that include integrated fan-out and/or stacked SiP devices that provide integration schemes that may combine different types of devices such as system-on-a chip (SoC) devices, memory devices, logic devices, and IPDs in a three dimensional (3D) thin fan-out package for applications such as next generation smart mobile applications, as an example. The SiP devices may also be implemented in other applications.

High bandwidth, high capacity integrated fan-out PoP devices can be achieved with some embodiments of the present disclosure. Various types of memory devices such as low power double data rate (LPDDR) memory devices and NAND memory devices may be integrated with SoC, IPDs, and/or other types of devices. Through-vias are coupled to contact pads on the various devices for vertical connections within the SiP packages. The various devices or chips are attached using an adhesive such as a DAF in various stacking configurations in some embodiments. Multiple IPDs can be integrated face to face (F2F) with a SoC and/or side-by-side (SBS) with a SoC in some embodiments. In some embodiments, a one-time molding process may be used for multiple stacked chips that include two-layer, three-layer or greater stacked chip structures. Two or more molding processes may also be used to form the molding material. The structured tiered layers may be greater than or equal to two, for example, and the number of chips in each tier may be greater than or equal to one, in some embodiments.

In some embodiments, a device includes a first interconnect structure, a first integrated circuit die coupled to the first interconnect structure, and a second integrated circuit die disposed over and coupled to the first integrated circuit die. A second interconnect structure is disposed over the second integrated circuit die. A plurality of first through-vias is coupled between the first interconnect structure and the second interconnect structure, and a plurality of second through-vias is coupled between the first integrated circuit die and the second interconnect structure. A molding material is disposed around the first integrated circuit die, the second integrated circuit die, the plurality of first through-vias, and the plurality of second through-vias.

In some embodiments, a packaged semiconductor device includes a first interconnect structure having first conductive features disposed thereon. A first integrated circuit die is coupled to the first interconnect structure, the first integrated circuit die having first contact pads disposed thereon. A second integrated circuit die is disposed over and is coupled to the first integrated circuit die, the second integrated circuit die having second contact pads disposed thereon. A second interconnect structure is disposed over the second integrated circuit die, the second interconnect structure having second conductive features, third conductive features, and fourth conductive features disposed thereon, the second conductive features of the second interconnect structure being coupled to the second contact pads of the second integrated circuit die. A plurality of first through-vias is coupled between the first conductive features of the first interconnect structure and the third conductive features of the second interconnect structure. A plurality of second through-vias is coupled between the first contact pads of the first integrated circuit die and the fourth conductive features of the second interconnect structure. A molding material is disposed around the first integrated circuit die, the second integrated circuit die, the plurality of first through-vias, and the plurality of second through-vias.

In some embodiments, a method of packaging semiconductor devices includes forming a first interconnect structure, coupling a plurality of first through-vias to the first interconnect structure, and coupling a first integrated circuit die to the first interconnect structure. A plurality of second through-vias is coupled to the first integrated circuit die, and a second integrated circuit die is coupled to the first integrated circuit die. A molding material is formed over the first interconnect structure and around the plurality of first through-vias, the first integrated circuit die, the plurality of second through-vias, and the second integrated circuit die. A second interconnect structure is formed over the molding material, the plurality of first through-vias, the plurality of second through-vias, and the second integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first interconnect structure;
   a plurality of first integrated circuit dies coupled to the first interconnect structure;
   an adhesive layer over each of the first integrated circuit dies;
   a second integrated circuit die disposed over and adhered to each of the first integrated circuit dies with the adhesive layer;
   a second interconnect structure disposed over the second integrated circuit die;
   a plurality of first through-vias coupled between the first interconnect structure and the second interconnect structure;
   a plurality of second through-vias coupled between the first integrated circuit dies and the second interconnect structure; and
   a molding material disposed around the first integrated circuit dies, the second integrated circuit die, the adhesive layer, the plurality of first through-vias, and the plurality of second through-vias.

2. The device according to claim 1, wherein each of the plurality of first integrated circuit dies is coupled to the first interconnect structure.

3. The device according to claim 1, further comprising a third integrated circuit die coupled between the plurality of first integrated circuit dies and the second integrated circuit die, and further comprising a plurality of third through-vias coupled between the third integrated circuit die and the second interconnect structure, the plurality of third through-vias being disposed within the molding material.

4. The device according to claim 3, further comprising a plurality of the third integrated circuit dies coupled between the plurality of first integrated circuit dies and the second integrated circuit die, wherein each of the plurality of third integrated circuit dies comprises a plurality of third through-vias coupled between the third integrated circuit die and the second interconnect structure.

5. The device according to claim 1, further comprising a plurality of the second integrated circuit dies, wherein each of the plurality of second integrated circuit dies is coupled to the first integrated circuit die.

6. The device according to claim 1, wherein the second integrated circuit die has contact pads, and the second interconnect structure is coupled to the contact pads of the second integrated circuit die by conductive pillars.

7. A packaged semiconductor device comprising:
   a first interconnect structure having first conductive features disposed thereon;
   a plurality of first integrated circuit dies coupled to the first interconnect structure, the first integrated circuit dies having first contact pads disposed thereon;
   a second integrated circuit die disposed over and adhered to each of the first integrated circuit dies with an adhesive layer, the second integrated circuit die having second contact pads disposed thereon;
   a second interconnect structure disposed over the second integrated circuit die, the second interconnect structure having second conductive features, third conductive features, and fourth conductive features disposed thereon, the second conductive features of the second interconnect structure being coupled to the second contact pads of the second integrated circuit die;
   a plurality of first through-vias coupled between the first conductive features of the first interconnect structure and the third conductive features of the second interconnect structure;
   a plurality of second through-vias coupled between the first contact pads of the first integrated circuit dies and the fourth conductive features of the second interconnect structure; and
   a molding material disposed around the first integrated circuit dies, the second integrated circuit die, the adhesive layer, the plurality of first through-vias, and the plurality of second through-vias.

8. The packaged semiconductor device according to claim 7, wherein the second conductive features of the second interconnect structure are coupled to the second contact pads of the second integrated circuit die by conductive pillars.

9. The packaged semiconductor device according to claim 7, wherein the second conductive features, third conductive features, and fourth conductive features of the second interconnect structure are disposed on a first side of the second interconnect structure, and further comprising a third integrated circuit die or a passive component coupled to a second side of the second interconnect structure, the second side of the second interconnect structure being opposite the first side of the second interconnect structure.

10. The packaged semiconductor device according to claim 7, wherein the second conductive features, third conductive features, and fourth conductive features of the second interconnect structure are disposed on a first side of the second interconnect structure, and further comprising a plurality of connectors coupled to a second side of the second interconnect structure, the second side of the second interconnect structure being opposite the first side of the second interconnect structure.

11. The packaged semiconductor device according to claim 10, wherein the packaged semiconductor device comprises a first packaged semiconductor device, further comprising a second packaged semiconductor device coupled to the plurality of connectors.

12. The packaged semiconductor device according to claim 7, wherein the first conductive features of the first interconnect structure are disposed on a first side of the first interconnect structure, and further comprising a plurality of connectors coupled to a second side of the first interconnect structure, the second side of the first interconnect structure being opposite the first side of the first interconnect structure.

13. A method of packaging semiconductor devices, the method comprising:
   forming a first interconnect structure over a carrier;
   coupling a plurality of first through-vias to the first interconnect structure;

coupling a first integrated circuit die to the first interconnect structure;
coupling a plurality of second through-vias to the first integrated circuit die;
coupling a second integrated circuit die to the first integrated circuit die;
forming a molding material over the first interconnect structure and around the plurality of first through-vias, the first integrated circuit die, the plurality of second through-vias, and the second integrated circuit die;
forming a second interconnect structure over the molding material, the plurality of first through-vias, the plurality of second through-vias, and the second integrated circuit die; and
after the forming the second interconnect structure, removing the carrier.

14. The method according to claim 13, wherein forming the first interconnect structure or forming the second interconnect structure comprises forming a redistribution layer (RDL) comprising fan-out wiring.

15. The method according to claim 13, wherein the method further comprises singulating the second interconnect structure, the molding material, and the first interconnect structure to form a plurality of packaged semiconductor devices.

16. The method according to claim 13, wherein coupling a second integrated circuit die to the first integrated circuit die comprises coupling a plurality of the second integrated circuit dies to the first integrated circuit die, and wherein coupling the plurality of second integrated circuit dies comprises coupling a vertical stack of the plurality of second integrated circuit dies.

17. The method according to claim 13, wherein coupling the second integrated circuit die to the first integrated circuit die comprises extending a portion of the second integrated circuit die over an edge of the first integrated circuit die.

18. The method according to claim 13, further comprising planarizing the molding material, after forming the molding material, wherein planarizing the molding material exposes a top surface of the plurality of first through-vias, a top surface of the plurality of second through-vias, and a top surface of contact pads of the second integrated circuit die, and wherein forming the second interconnect structure comprises coupling conductive features of the second interconnect structure to the top surface of the plurality of first through-vias, the top surface of the plurality of second through-vias, and the top surface of contact pads of the second integrated circuit die.

19. The method according to claim 13, wherein forming the plurality of first through-vias comprises forming a first portion of the plurality of first through-vias to the first interconnect structure, before coupling the first integrated circuit die to the first interconnect structure, and forming a second portion of the plurality of first through-vias over the first portion of the plurality of first through-vias while coupling the plurality of second through-vias to the first integrated circuit die; and wherein forming the molding material comprises forming a first layer of molding material around the first integrated circuit die and the first portion of the plurality of first through-vias, and forming a second layer of molding material around the second integrated circuit die, the second portion of the plurality of first through-vias, and the plurality of second through-vias.

20. The method according to claim 13, wherein the coupling the second integrated circuit die to the first integrated circuit die comprises forming an adhesive layer over the first integrated circuit die, and adhering the second integrated circuit die to the first integrated circuit die with the adhesive layer.

* * * * *